(12) United States Patent
Mizushima

(10) Patent No.: US 9,842,846 B2
(45) Date of Patent: Dec. 12, 2017

(54) SEMICONDUCTOR DEVICE AND METHOD OF MANUFACTURING THE SAME

(71) Applicant: Renesas Electronics Corporation, Koutou-ku, Tokyo (JP)

(72) Inventor: Hiroaki Mizushima, Koutou-ku (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/248,470

(22) Filed: Aug. 26, 2016

(65) Prior Publication Data

US 2017/0062443 A1 Mar. 2, 2017

(30) Foreign Application Priority Data

Aug. 28, 2015 (JP) ................................. 2015-168753

(51) Int. Cl.
| H01L 29/788 | (2006.01) |
| H01L 27/11534 | (2017.01) |
| H01L 29/423 | (2006.01) |

(52) U.S. Cl.
CPC .. *H01L 27/11534* (2013.01); *H01L 29/42328* (2013.01)

(58) Field of Classification Search
CPC .................................................. H01L 27/11517
See application file for complete search history.

(56) References Cited

U.S. PATENT DOCUMENTS

| 5,268,319 | A | * | 12/1993 | Harari | ................. | G11C 11/5621 |
| | | | | | | 257/320 |
| 6,184,093 | B1 | * | 2/2001 | Sung | ............... | H01L 21/823462 |
| | | | | | | 257/E21.625 |
| 2003/0075757 | A1 | * | 4/2003 | Fujiwara | ........... | H01L 21/28273 |
| | | | | | | 257/315 |
| 2003/0113969 | A1 | * | 6/2003 | Cho | .................. | H01L 21/28273 |
| | | | | | | 438/257 |
| 2004/0065917 | A1 | * | 4/2004 | Fan | ................... | H01L 27/11521 |
| | | | | | | 257/315 |
| 2009/0039410 | A1 | | 2/2009 | Liu et al. | | |
| 2011/0286284 | A1 | * | 11/2011 | Wang | ................ | H01L 27/11521 |
| | | | | | | 365/185.29 |
| 2014/0126299 | A1 | * | 5/2014 | Fukumoto | .......... | G11C 16/0416 |
| | | | | | | 365/185.33 |
| 2014/0151782 | A1 | * | 6/2014 | Tsair | ................... | H01L 29/7881 |
| | | | | | | 257/320 |
| 2015/0364558 | A1 | * | 12/2015 | Wu | ................... | H01L 29/42368 |
| | | | | | | 257/316 |

FOREIGN PATENT DOCUMENTS

| JP | 2003-124360 A | 4/2003 |
| JP | 2009-44164 A | 2/2009 |

\* cited by examiner

*Primary Examiner* — Sitaramarao S Yechuri
(74) *Attorney, Agent, or Firm* — Sughrue Mion, PLLC

(57) ABSTRACT

In a semiconductor substrate, a memory cell region in which a flash memory cell is formed is defined by an element isolation region. A floating gate electrode of the flash memory cell includes a protruding portion protruding toward an erase gate electrode so as to flare from a portion located immediately below a control gate electrode. Protruding portion includes an end face of a height corresponding to a thickness, and an inclined surface continuous with end face. Protruding portion faces erase gate electrode with a tunnel oxide film interposed therebetween.

11 Claims, 41 Drawing Sheets

ERASE

ERASE

SEMICONDUCTOR DEVICE AND METHOD OF MANUFACTURING THE SAME

This nonprovisional application is based on Japanese Patent Application No. 2015-168753 filed on Aug. 28, 2015, with the Japan Patent Office, the entire contents of which are hereby incorporated by reference.

BACKGROUND OF THE INVENTION

Field of the Invention

The present invention relates to a semiconductor device and a method of manufacturing the same, and can be suitably utilized, for example, for a semiconductor device including a flash memory.

Description of the Background Art

Semiconductor devices such as a logic device are equipped with a nonvolatile flash memory that stores information. One form of the flash memory includes a select gate electrode, a floating gate electrode, a control gate electrode, an erase gate electrode, a source region and a drain region. This type of flash memory is disclosed in Patent Document 1 (Japanese Patent Laying-Open No. 2009-44164).

In the flash memory, information is written by applying a prescribed voltage to each of the source region, the control gate electrode, the select gate electrode and the drain region, to inject electrons into the floating gate electrode from the drain region. Information is erased by applying another prescribed voltage to the erase gate electrode, to draw the electrons stored in the floating gate electrode into the erase gate electrode.

Information is read by applying still another prescribed voltage to each of the control gate electrode, the select gate electrode and the drain region, to determine whether or not a current (read current) flows between the drain region and the source region. If the electrons have been stored in the floating gate electrode, very little read current flows. If the electrons have not been stored in the floating gate electrode, on the other hand, the read current flows. When the read current is low, an incorrect determination may be made as to whether or not information has been written. Thus, erase characteristics are considered to be important characteristics of a flash memory.

SUMMARY OF THE INVENTION

For a semiconductor device including a flash memory, various proposals to improve the erase characteristics of the flash memory have been conventionally made as described, for example, in Patent Document 2 (Japanese Patent Laying-Open No. 2003-124360). As part of this effort, the inventor seeks to further improve the erase characteristics of a semiconductor device including a flash memory.

The other objects and new features will become apparent from the description of the present specification and the accompanying drawings.

A semiconductor device according to one embodiment is a semiconductor device including a flash memory, and has a floating gate electrode, a control gate electrode, and an erase gate electrode. The floating gate electrode is formed on a semiconductor substrate with a first gate insulating film interposed therebetween, and has a first thickness. The control gate electrode is formed on the floating gate electrode with a first insulating film interposed therebetween. The erase gate electrode is formed on one side surface of the control gate electrode with a sidewall insulating film including a tunnel insulating film interposed therebetween. The floating gate electrode includes a protruding portion protruding toward the erase gate electrode so as to flare from a portion located immediately below the control gate electrode, the protruding portion having an end face of a height corresponding to a second thickness smaller than the first thickness and an inclined surface continuous with the end face. The protruding portion faces the erase gate electrode with the tunnel insulating film interposed therebetween.

A method of manufacturing a semiconductor device according to another embodiment is a method of manufacturing a semiconductor device including a flash memory, and includes the following steps. A first gate insulating film is formed on a surface of a semiconductor substrate. A first conductive film having a first film thickness, a first insulating film, and a second conductive film are successively formed on the first gate insulating film. A first mask material is formed on the second conductive film. An etching process is performed on the second conductive film with the first mask material as an etching mask, to form a control gate electrode. An etching process is further performed on the first conductive film with the first mask material as an etching mask, to remove the first conductive film while leaving the first conductive film on the first gate insulating film so as to flare from a portion of the first conductive film located immediately below the second conductive film toward a direction intersecting a direction in which the control gate electrode extends. A second mask material is formed to cover side surfaces of the control gate electrode. An etching process is performed on the remaining first conductive film with the second mask material as an etching mask, to form a floating gate electrode including a protruding portion protruding from one of the side surfaces of the control gate electrode for a length corresponding to a thickness of the second mask material, the protruding portion having an end face of a height corresponding to a second film thickness smaller than the first film thickness and an inclined surface continuous with the end face. A tunnel insulating film is formed to cover the protruding portion of the floating gate electrode. An erase gate electrode is formed to face the protruding portion of the floating gate electrode with the tunnel insulating film interposed therebetween.

According to the semiconductor device in accordance with one embodiment, the erase characteristics of the flash memory can be improved.

According to the method of manufacturing a semiconductor device in accordance with another embodiment, the semiconductor device with improved erase characteristics of the flash memory can be manufactured.

DESCRIPTION OF THE PREFERRED EMBODIMENTS

First Embodiment

A semiconductor device including a flash memory according to a first embodiment is described.

Figure 1:
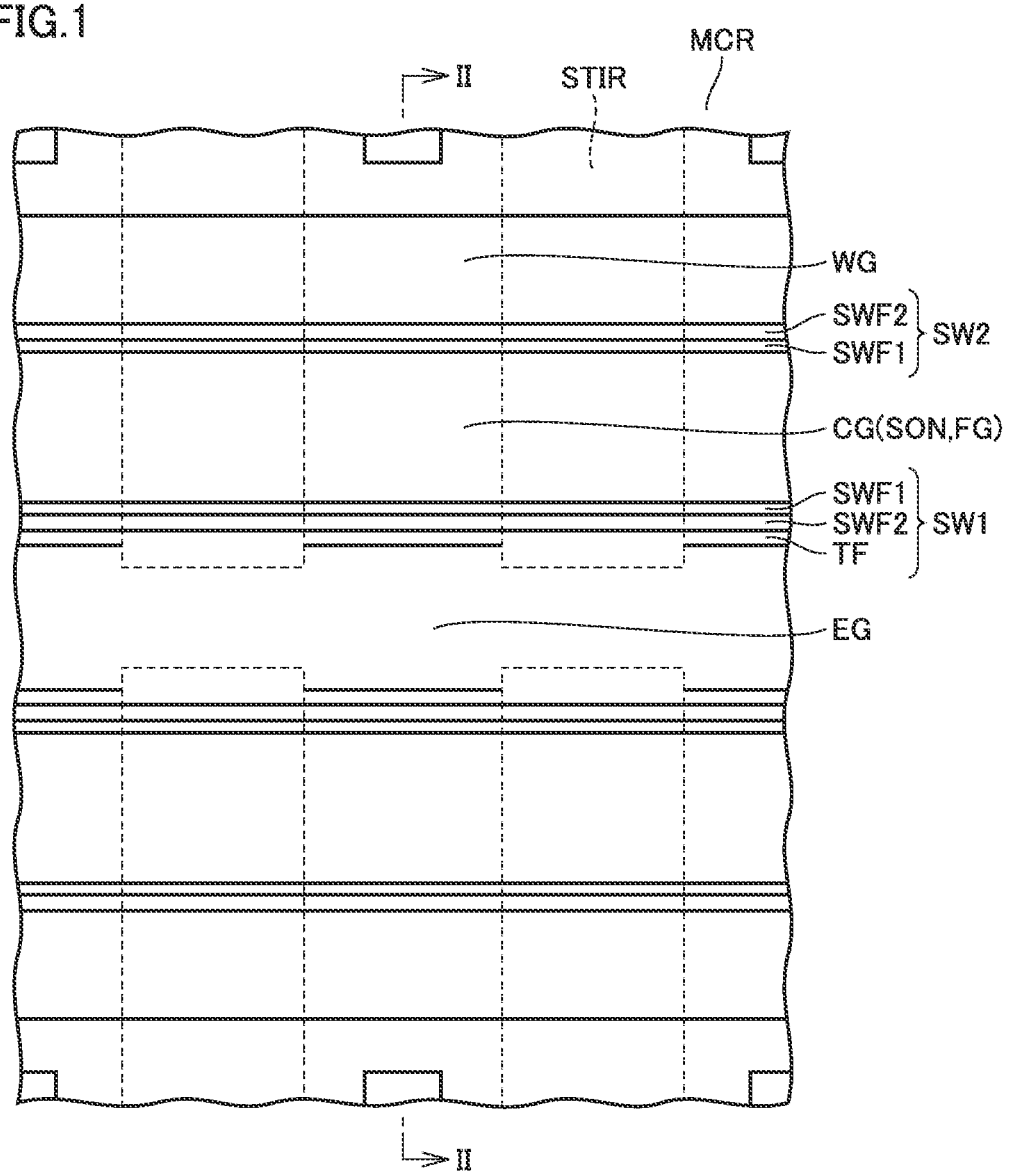
FIG. 1 is a plan view showing a memory cell region in which a flash memory is formed in a semiconductor device according to a first embodiment.
Figure 2:
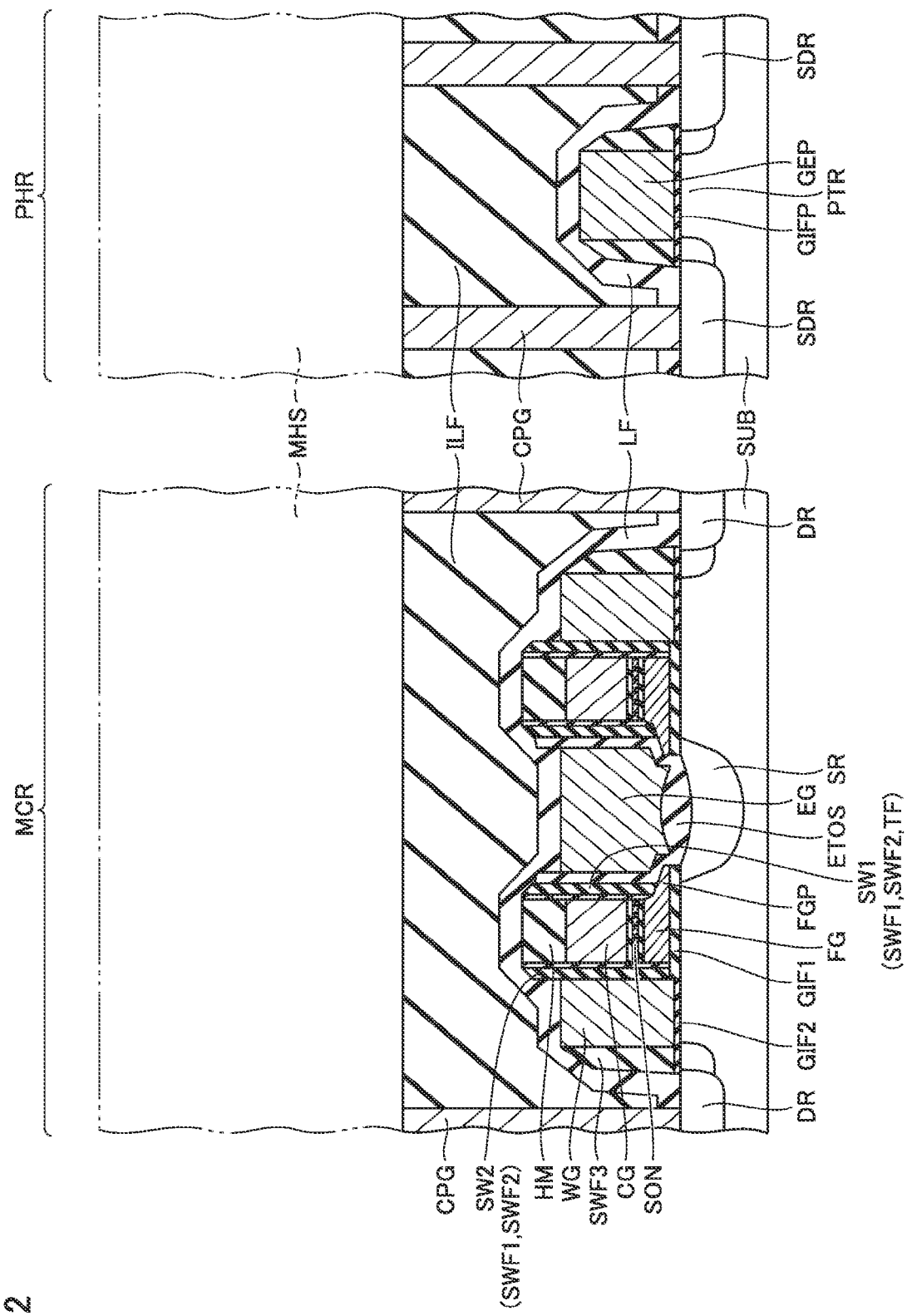
FIG. 2 is a cross-sectional view of the semiconductor device, which includes a cross-sectional view of the memory cell region taken along a cross-sectional line II-II shown in FIG. 1 and a cross-sectional view of a peripheral circuit region, in the same embodiment.

As shown in FIGS. 1 and 2, in a memory cell region MCR of a semiconductor substrate SUB, regions in which flash memories are formed are defined by an element isolation region STIR. In semiconductor substrate SUB, in addition to memory cell region MCR, a peripheral circuit region PHR (not shown in FIG. 1) in which a peripheral circuit is formed is defined by an element isolation region (not shown).

In memory cell region MCR, a floating gate electrode FG is formed on semiconductor substrate SUB with a gate insulating film GIF1 interposed therebetween. A control gate electrode CG is formed on floating gate electrode FG with a laminated insulating film SON interposed therebetween. In laminated insulating film SON, for example, a silicon oxide film, a silicon nitride film and a silicon oxide film are successively laminated.

An erase gate electrode EG is formed on one side surface of control gate electrode CG and the like, with a sidewall insulating film SW1 interposed therebetween. Erase gate electrode EG is also formed on semiconductor substrate SUB with a silicon oxide film ETOS interposed therebetween. Sidewall insulating film SW1 is formed of a silicon oxide film SWF1, a silicon nitride film SWF2, and a tunnel oxide film TF.

A select gate electrode WG is formed on the other side surface of control gate electrode CG and floating gate electrode FG, with a sidewall insulating film SW2 interposed therebetween. Select gate electrode WG is also formed on semiconductor substrate SUB with a gate insulating film GIF2 interposed therebetween. Sidewall insulating film SW2 is formed of silicon oxide film SWF1 and silicon nitride film SWF2.

A source region SR is formed in a region of semiconductor substrate SUB across floating gate electrode FG from where select gate electrode WG is located. Silicon oxide film ETOS is formed on the surface of source region SR. A drain region DR is formed in a region of semiconductor substrate SUB across select gate electrode WG from where floating gate electrode FG is located.

In this semiconductor device, control gate electrode CG, floating gate electrode FG and select gate electrode WG of one memory cell are arranged substantially line-symmetrically with respect to a center of erase gate electrode EG in a direction (parallel to the plane of the figure) intersecting a direction in which erase gate electrode EG extends (perpendicular to the plane of the figure). Erase gate electrode EG serves as an erase gate electrode common to a half of the memory cell and the other half of the memory cell. Likewise, source region SR serves as a common source region.

In peripheral circuit region PHR, for example, a peripheral transistor PTR is formed. A gate electrode GEP is formed on semiconductor substrate SUB with a gate insulating film GIFP interposed therebetween. A source/drain region SDR is formed in each of opposite regions of semiconductor substrate SUB with respect to gate electrode GEP.

A liner film LF made of a silicon nitride film is formed to cover control gate electrode CG, select gate electrode WG and the like in memory cell region MCR, and to cover gate electrode GEP (peripheral transistor PTR) and the like in peripheral circuit region PHR. An interlayer insulating film ILF made of a TEOS (Tetra Ethyl Ortho Silicate) film and the like, for example, is formed to cover liner film LF.

A plurality of contact plugs CPG are formed to penetrate interlayer insulating film ILF. In memory cell region MCR, one contact plug CPG is electrically connected to drain region DR. In peripheral circuit region PHR, another contact plug CPG is electrically connected to source/drain region SDR. A plurality of interlayer insulating films and wiring layers are formed over interlayer insulating film ILF (see the area indicated with chain-double-dotted lines).

Figure 3:
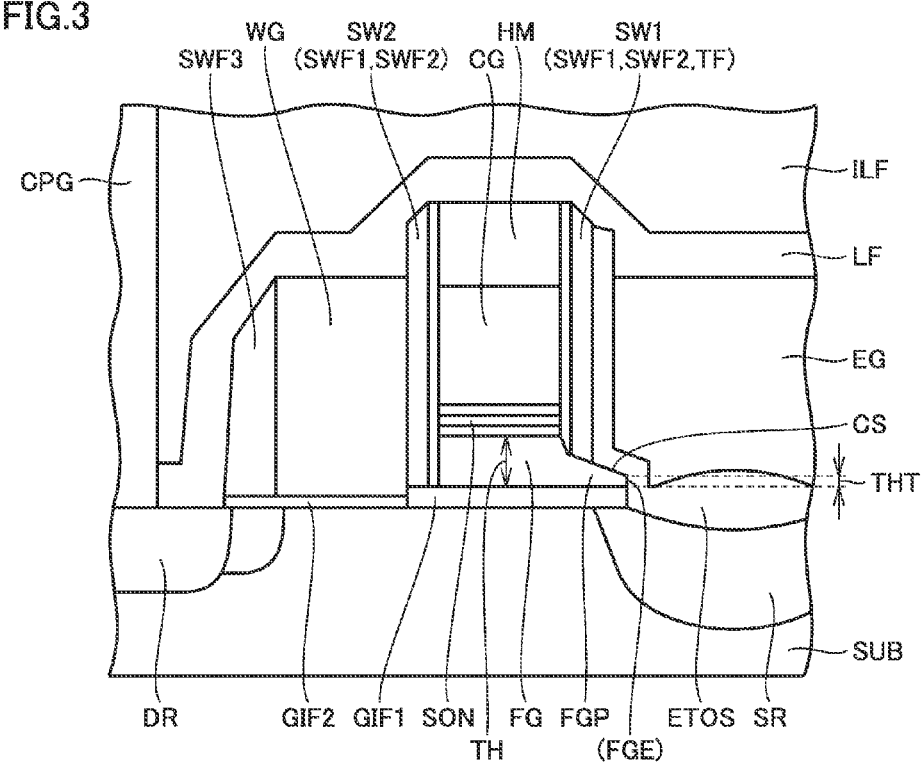
FIG. 3 is a fragmentary enlarged cross-sectional view showing a floating gate electrode and its peripheral structure in the same embodiment.

Next, the structure of floating gate electrode FG of the flash memory cell is described in further detail. As shown in FIG. 3, floating gate electrode FG includes a protruding portion FGP protruding toward erase gate electrode EG so as to flare from a portion located immediately below control gate electrode CG.

Protruding portion FGP includes an end face FGE of a height corresponding to a thickness THT, and an inclined surface CS continuous with end face FGE. Thickness THT is preferably about 10 to 20 nm. Protruding portion FGP faces erase gate electrode EG with tunnel oxide film TF interposed therebetween. A substantial part of the semiconductor device according to the first embodiment is configured as described above.

Figure 4:
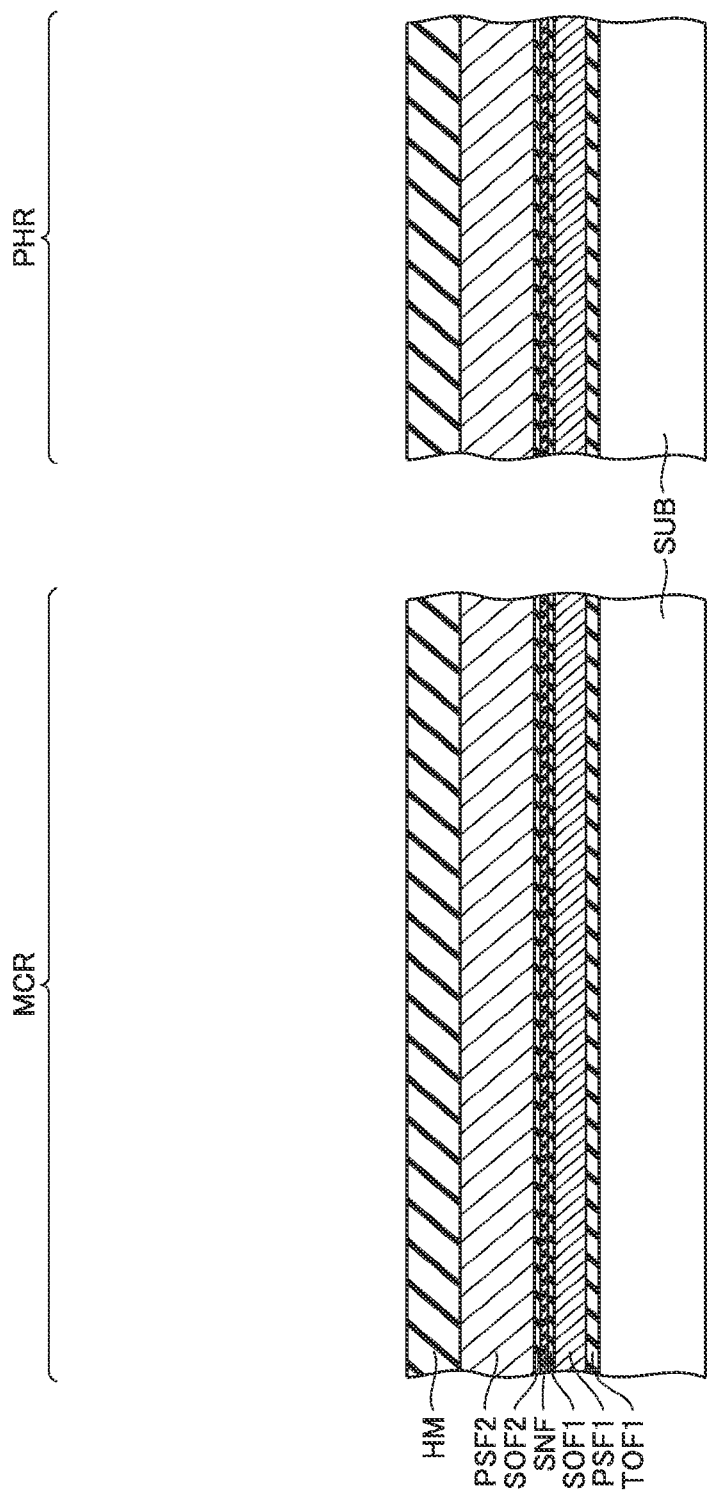
FIG. 4 is a cross-sectional view showing a step of a method of manufacturing the semiconductor device in the same embodiment.
Figure 5:
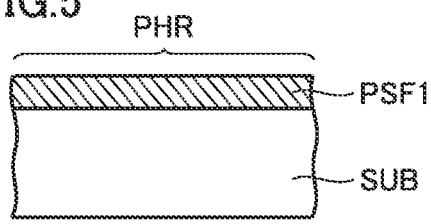
FIG. 5 is a fragmentary cross-sectional view showing a step, when forming a polysilicon film on a semiconductor substrate, of forming a monitor pattern of the polysilicon film, in the step shown in FIG. 4 in the same embodiment.

Next, an example of a method of manufacturing the above-discussed semiconductor device is described. As shown in FIG. 4, first, a thermal oxidation process is performed to form a silicon oxide film TOF1 which becomes gate insulating film GIF1. Then, a polysilicon film PSF1 having a prescribed film thickness (first thickness, first film thickness) is formed by a CVD (Chemical Vapor Deposition) process, for example. On this occasion, a monitor pattern of polysilicon film PSF1 is simultaneously formed, as shown in FIG. 5, on semiconductor substrate SUB on which a product is formed. As will be described later, this monitor pattern is used to measure the film thickness of polysilicon film PSF1.

Then, a silicon oxide film SOF1, a silicon nitride film SNF and a silicon oxide film SOF2 are successively formed by a CVD process to cover polysilicon film PSF1. Then, a polysilicon film PSF2 is formed by a CVD process to cover silicon oxide film SOF2. Then, a silicon nitride film HM which becomes a hard mask is formed by a CVD process.

Figure 6:
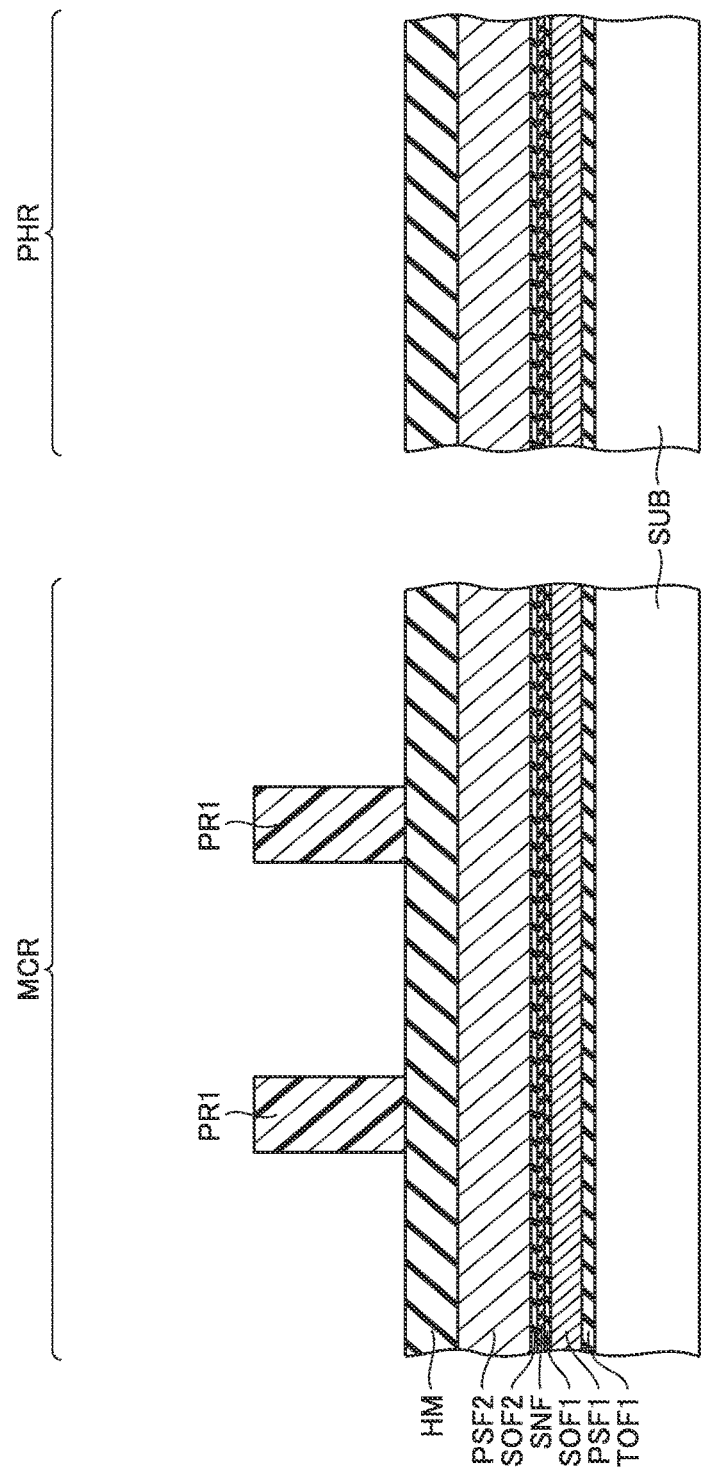
FIG. 6 is a cross-sectional view showing a step performed after the step shown in FIG. 4 in the same embodiment.

Then, as shown in FIG. 6, a prescribed photolithography process is performed to form a photoresist pattern PR1. Then, an etching process is performed on silicon nitride film HM with photoresist pattern PR1 as an etching mask, to form the hard mask of silicon nitride film HM. Then, an etching process is performed on polysilicon film PSF2 with the hard mask of silicon nitride film HM and the like as an etching mask, to form control gate electrode CG (see FIG. 7). An etching process is further performed to pattern laminated insulating film SON, thus exposing polysilicon film PSF1.

Figure 7:
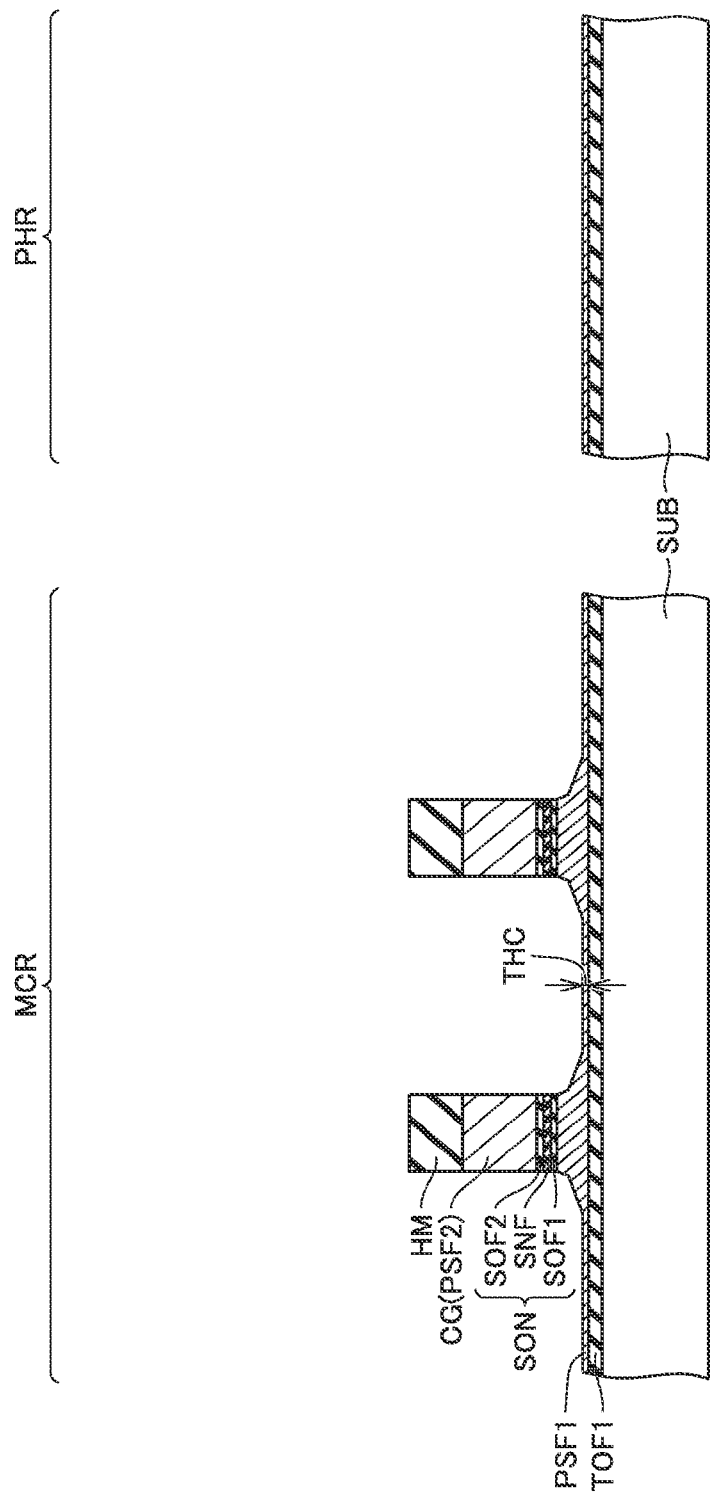
FIG. 7 is a cross-sectional view showing a step performed after the step shown in FIG. 6 in the same embodiment.

Then, as shown in FIG. 7, an etching process is performed on polysilicon film PSF1 now exposed, to remove polysilicon film PSF1 while leaving polysilicon film PSF1 on silicon oxide film TOF1 so as to flare from a portion located immediately below control gate electrode CG toward a direction intersecting the direction in which control gate electrode CG extends.

On this occasion, the film thickness of polysilicon film PSF1 formed as the monitor pattern is measured, and etching time required to leave a film thickness THC on silicon oxide film TOF1 is calculated from data on the film thickness. An etching process is performed on polysilicon film PSF1 based on the etching time. Film thickness THC is set such that a portion of polysilicon film PSF1 which ultimately becomes the end face has desired thickness THT (about 10 nm to 20 nm).

Figure 8:
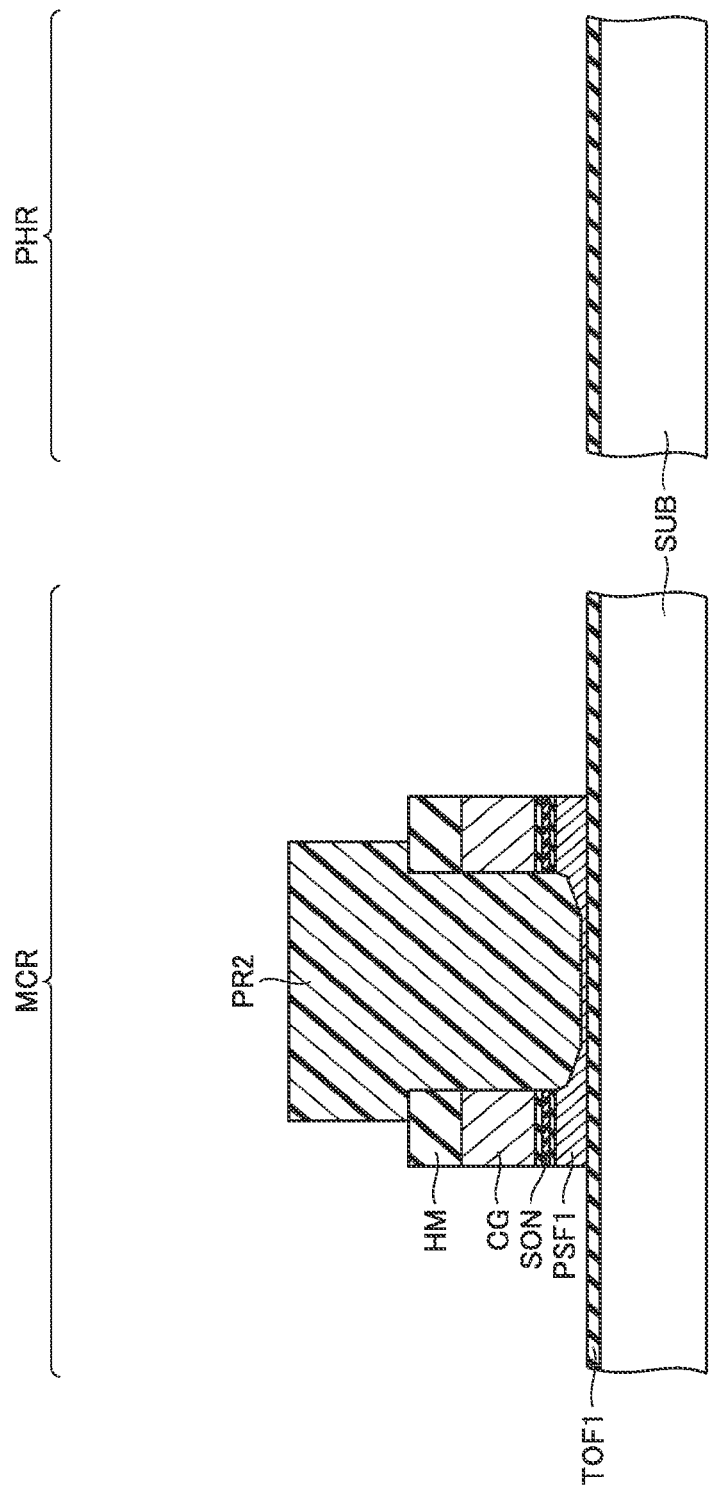
FIG. 8 is a cross-sectional view showing a step performed after the step shown in FIG. 7 in the same embodiment.

Then, as shown in FIG. 8, a prescribed photolithography process is performed to form a photoresist pattern PR2. Photoresist pattern PR2 is formed to cover one side portion of polysilicon film PSF1 flaring from a portion located immediately below control gate electrodes CG toward opposite sides. Then, an etching process is performed with photoresist pattern PR2 as an etching mask, to remove the exposed portion of polysilicon film PSF1. Photoresist pattern PR2 is then removed.

Figure 9:
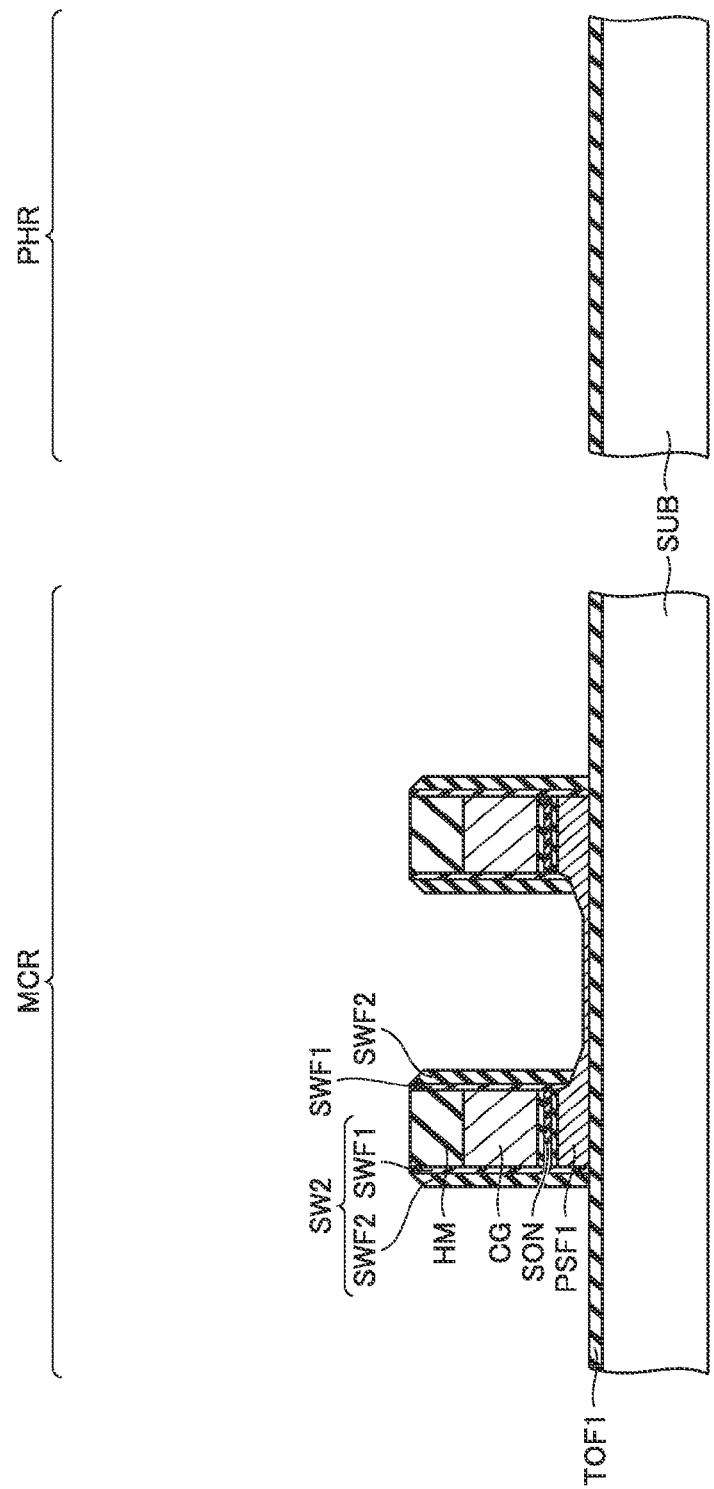
FIG. 9 is a cross-sectional view showing a step performed after the step shown in FIG. 8 in the same embodiment.

Then, a silicon oxide film and a silicon nitride film (neither shown) are formed to cover control gate electrode CG and the like. Then, an anisotropic etching process is performed on the silicon nitride film and the silicon oxide film to form silicon oxide film SWF1 and silicon nitride film SWF2 covering one side surface of control gate electrode CG, as shown in FIG. 9. Sidewall insulating film SW2 formed of silicon oxide film SWF1 and silicon nitride film SWF2 is formed on the other side surface of control gate electrode CG.

Figure 10:
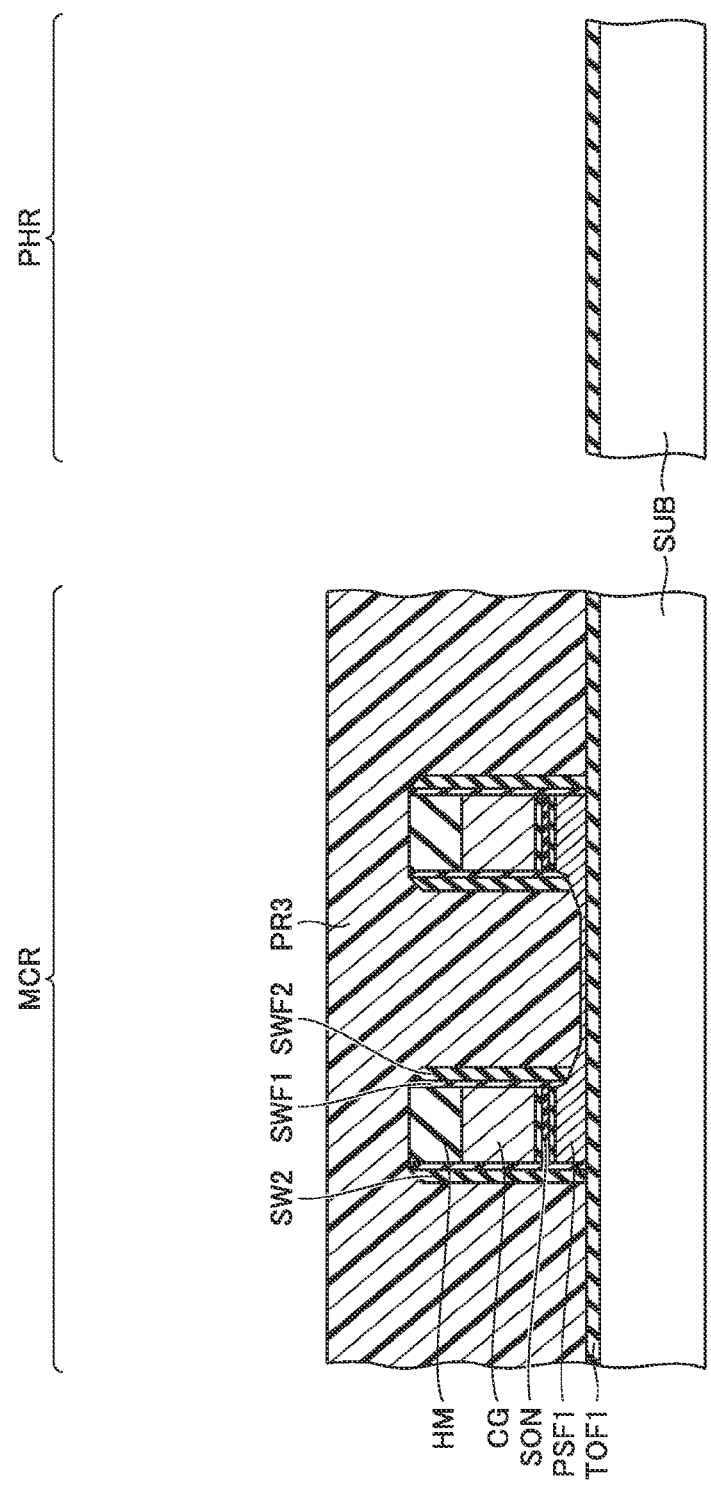
FIG. 10 is a cross-sectional view showing a step performed after the step shown in FIG. 9 in the same embodiment.

Then, as shown in FIG. 10, a prescribed photolithography process is performed to form a photoresist pattern PR3 exposing peripheral circuit region PHR and covering memory cell region MCR. Then, an impurity of a prescribed conductivity type is implanted with photoresist pattern PR3 as an implantation mask, to form a well (not shown) and the like for forming the peripheral transistor. Photoresist pattern PR3 is then removed.

Figure 11:
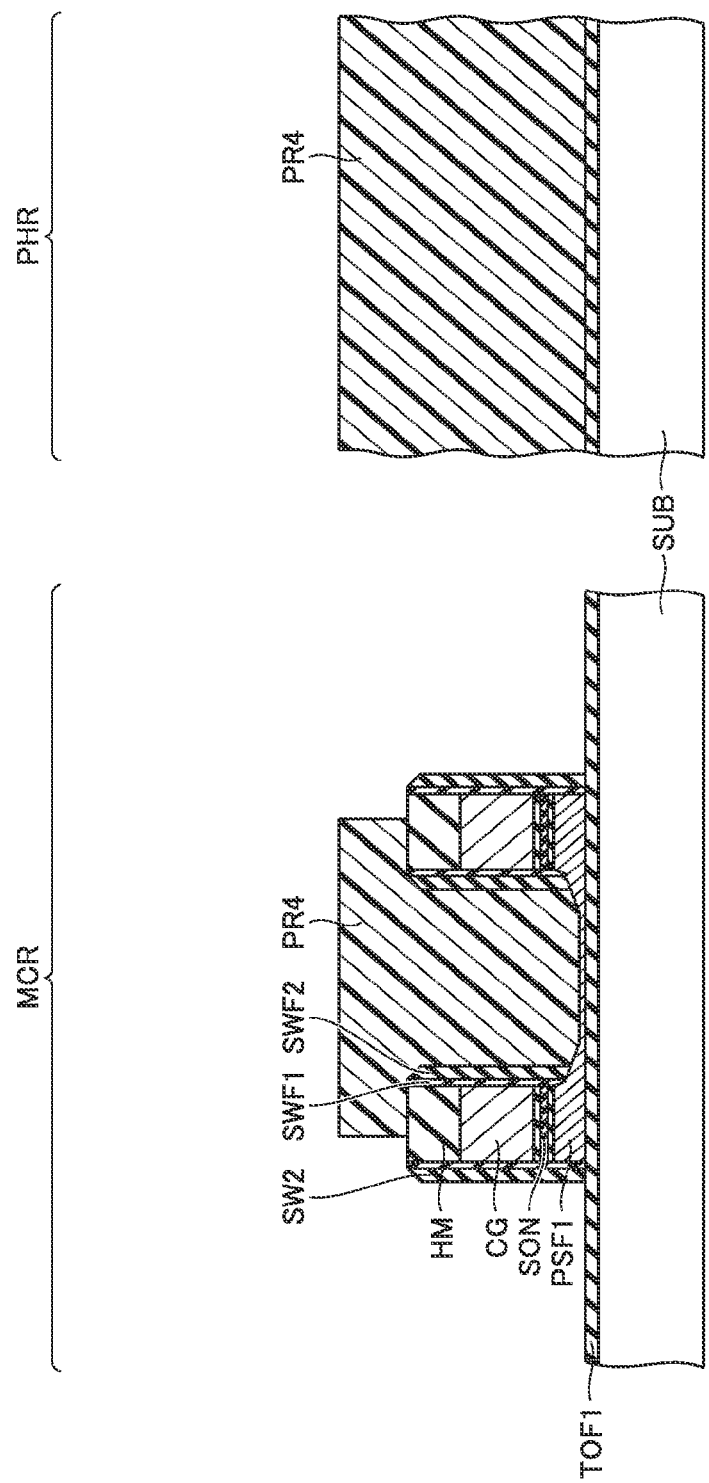
FIG. 11 is a cross-sectional view showing a step performed after the step shown in FIG. 10 in the same embodiment.

Then, as shown in FIG. 11, a prescribed photolithography process is performed to form a photoresist pattern PR4 exposing a region in which the select gate electrode and the like are to be formed and covering the other regions. Then, an impurity of a prescribed conductivity type (not shown) is implanted with photoresist pattern PR4 as an implantation mask. Photoresist pattern PR4 is then removed.

Figure 12:
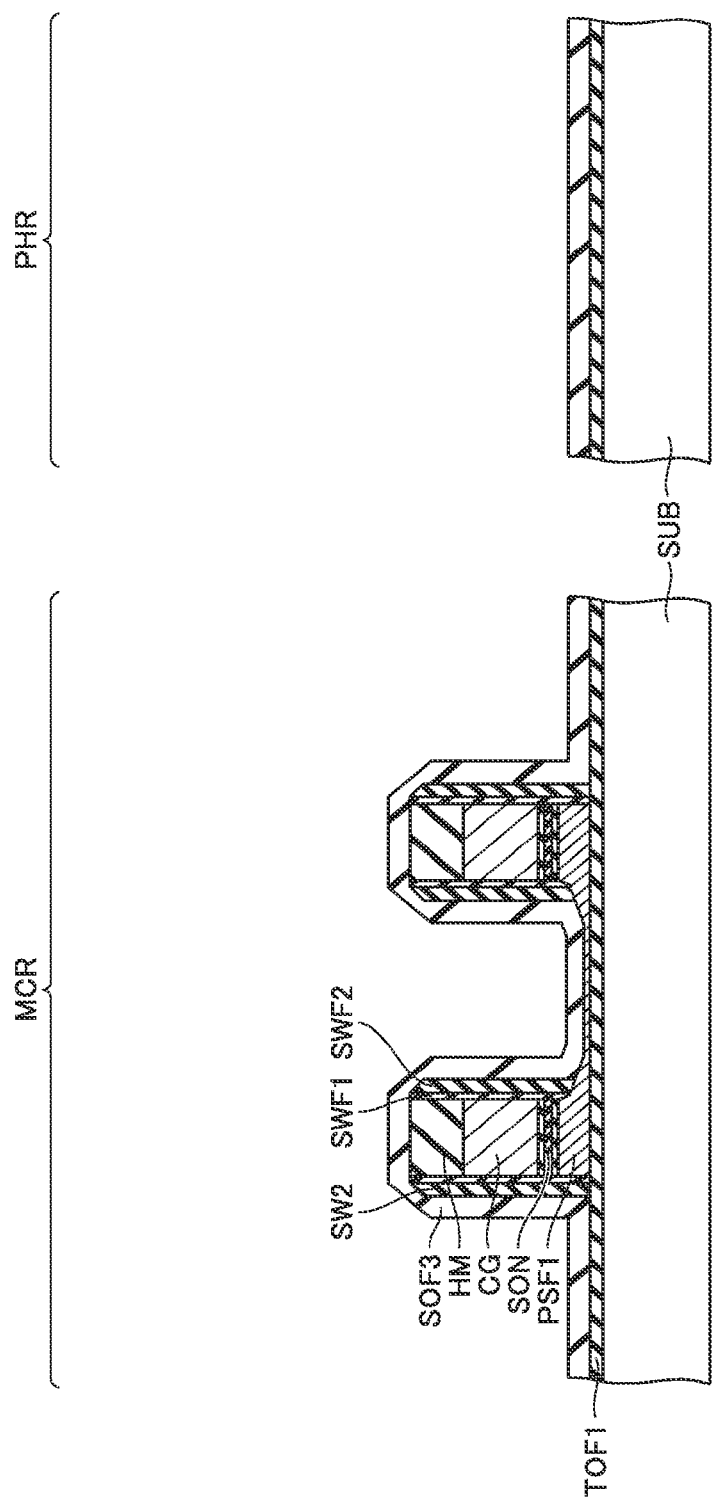
FIG. 12 is a cross-sectional view showing a step performed after the step shown in FIG. 11 in the same embodiment.
Figure 13:
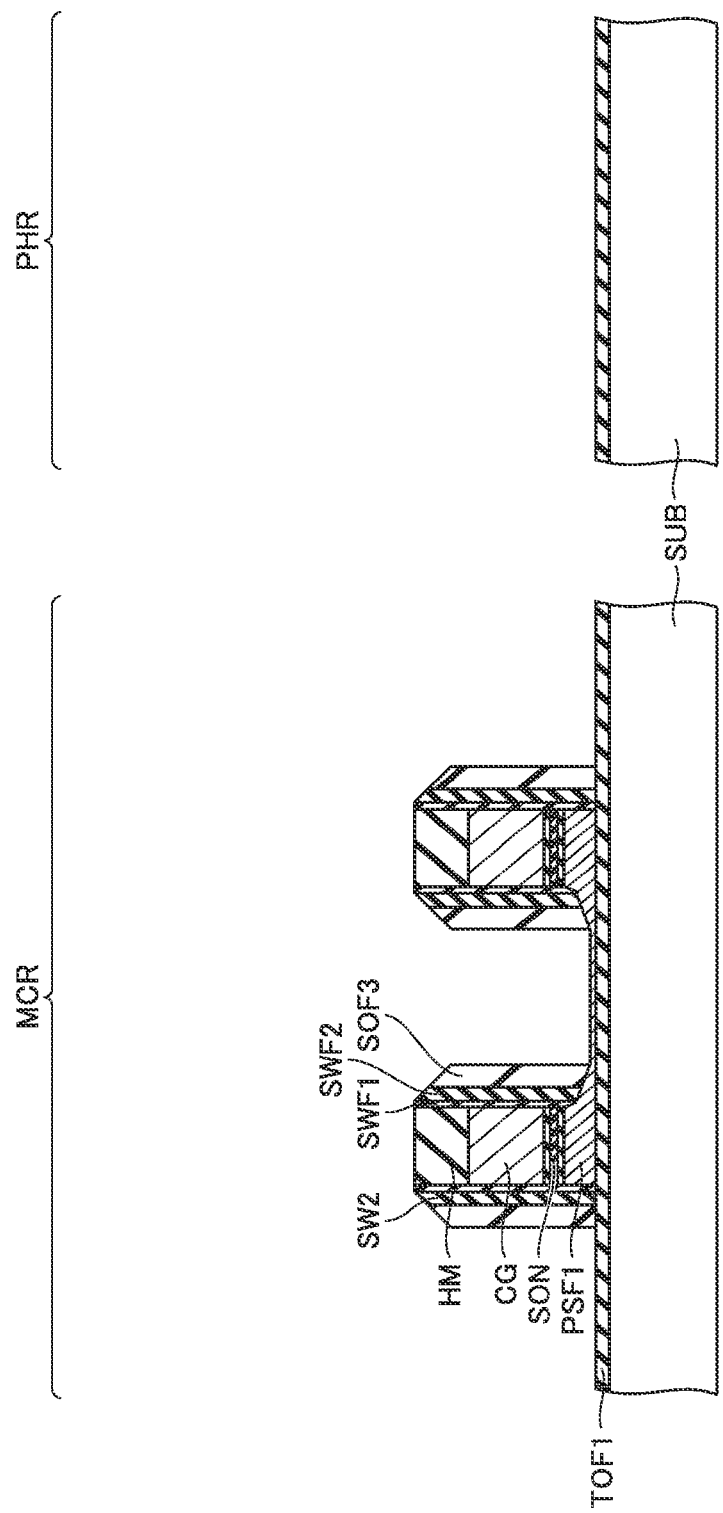
FIG. 13 is a cross-sectional view showing a step performed after the step shown in FIG. 12 in the same embodiment.

Then, as shown in FIG. 12, a silicon oxide film SOF3 is formed by a CVD process, for example, to cover control gate electrode CG, silicon nitride film SWF2 and the like. Then, as shown in FIG. 13, anisotropic etching is performed on silicon oxide film SOF3 to leave a portion of silicon oxide film SOF3 covering silicon nitride film SWF2 and remove silicon oxide film SOF2 located at the other portions.

Figure 14:
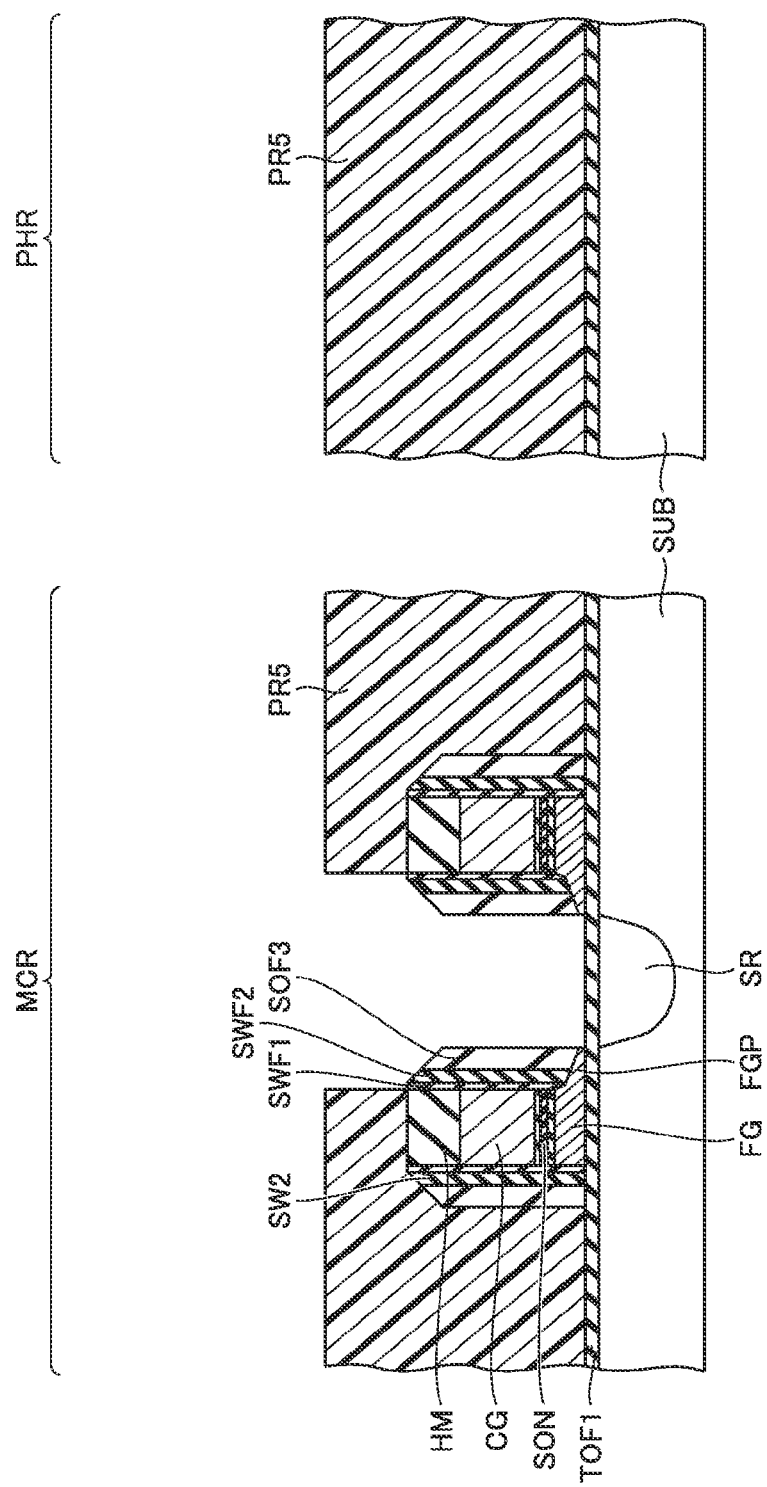
FIG. 14 is a cross-sectional view showing a step performed after the step shown in FIG. 13 in the same embodiment.

Then, as shown in FIG. 14, a prescribed photolithography process is performed to form a photoresist pattern PR5. Photoresist pattern PR5 is formed to expose the flaring side of polysilicon film PSF1. Then, a dry etching process is performed with photoresist pattern PR5 as an etching mask, to remove exposed polysilicon film PSF1 and form floating gate electrode FG. Then, an impurity of a prescribed conductivity type (arsenic, for example) is implanted with photoresist pattern PR5 as an implantation mask, to form source region SR.

Figure 15:
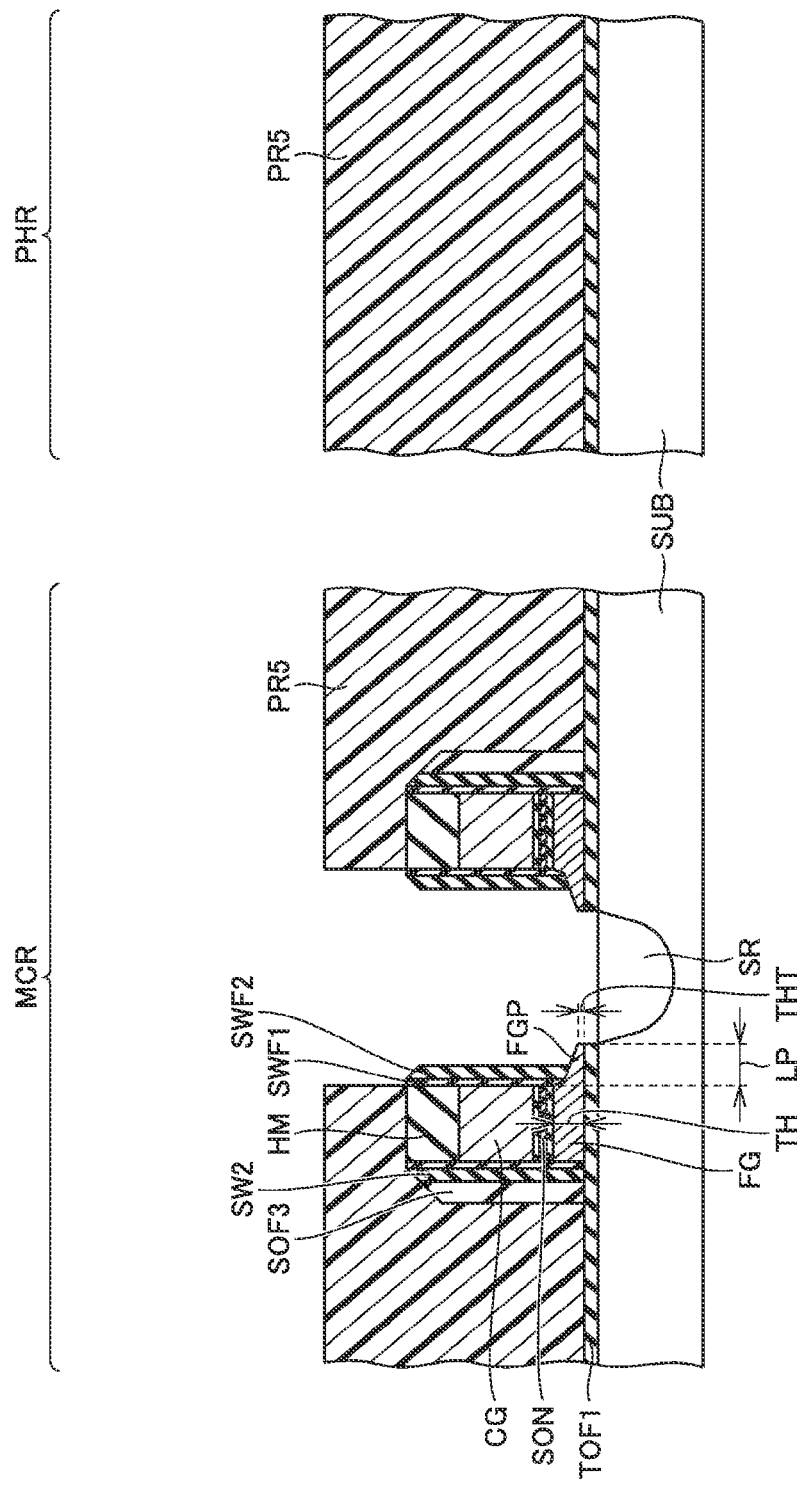
FIG. 15 is a cross-sectional view showing a step performed after the step shown in FIG. 14 in the same embodiment.

Then, a wet etching process is performed with photoresist pattern PR5 as an etching mask, to remove exposed silicon oxide film SOF3 and silicon oxide film TOF1. Consequently, as shown in FIG. 15, protruding portion FGP of floating gate electrode FG is exposed. Protruding portion FGP protrudes toward a region in which erase gate electrode EG (see FIG. 2) is to be located, so as to flare from a portion located immediately below control gate electrode CG.

Protruding portion FGP includes end face FGE of a height corresponding to thickness THT (see FIG. 3), and inclined surface CS continuous with end face FGE (see FIG. 3). Moreover, a length LP of protruding portion FGP protruding from the side surface of control gate electrode CG corresponds to a combined thickness of silicon oxide film SWF1, silicon nitride film SWF2 and silicon oxide film SOF3 (see FIG. 14). Photoresist pattern PR5 is then removed.

Figure 16:
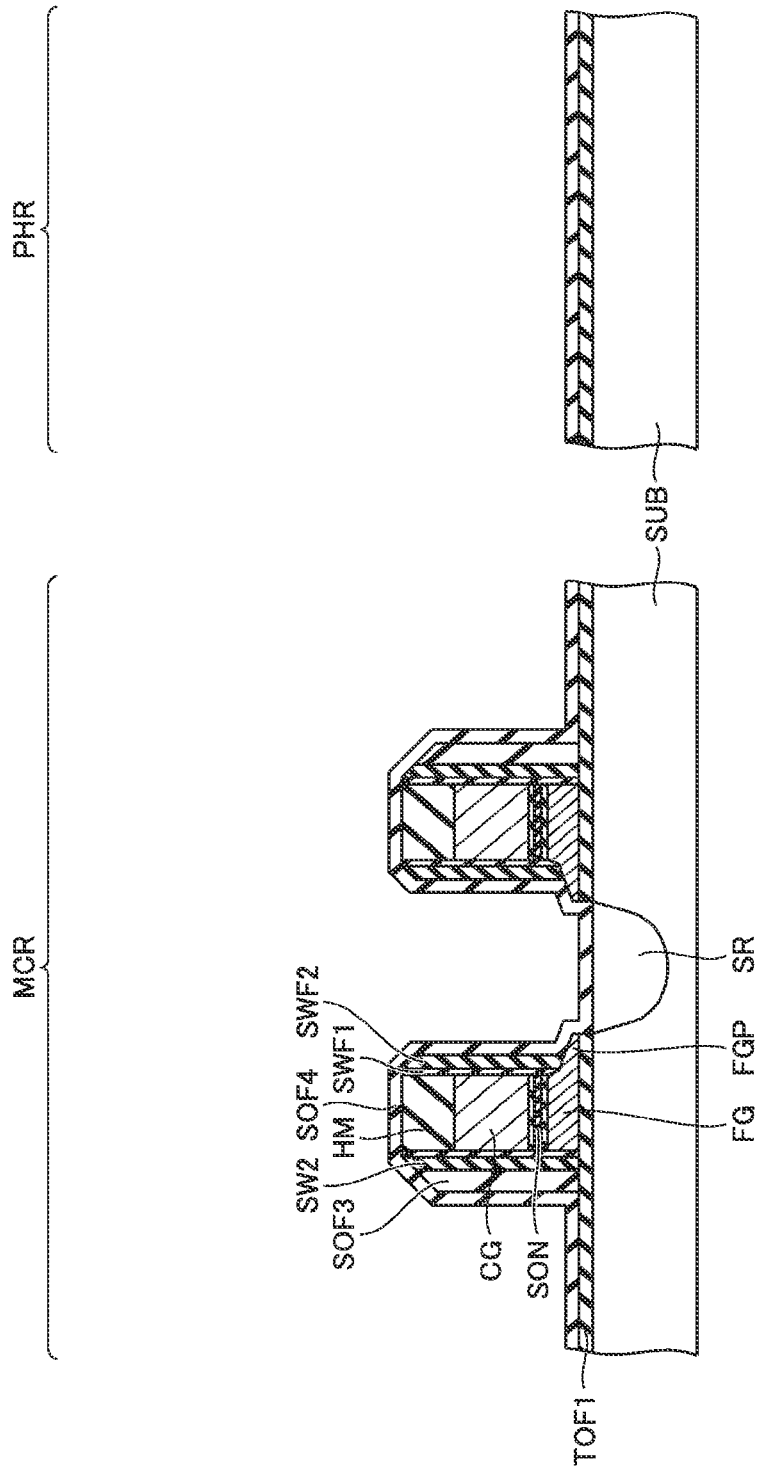
FIG. 16 is a cross-sectional view showing a step performed after the step shown in FIG. 15 in the same embodiment.
Figure 17:
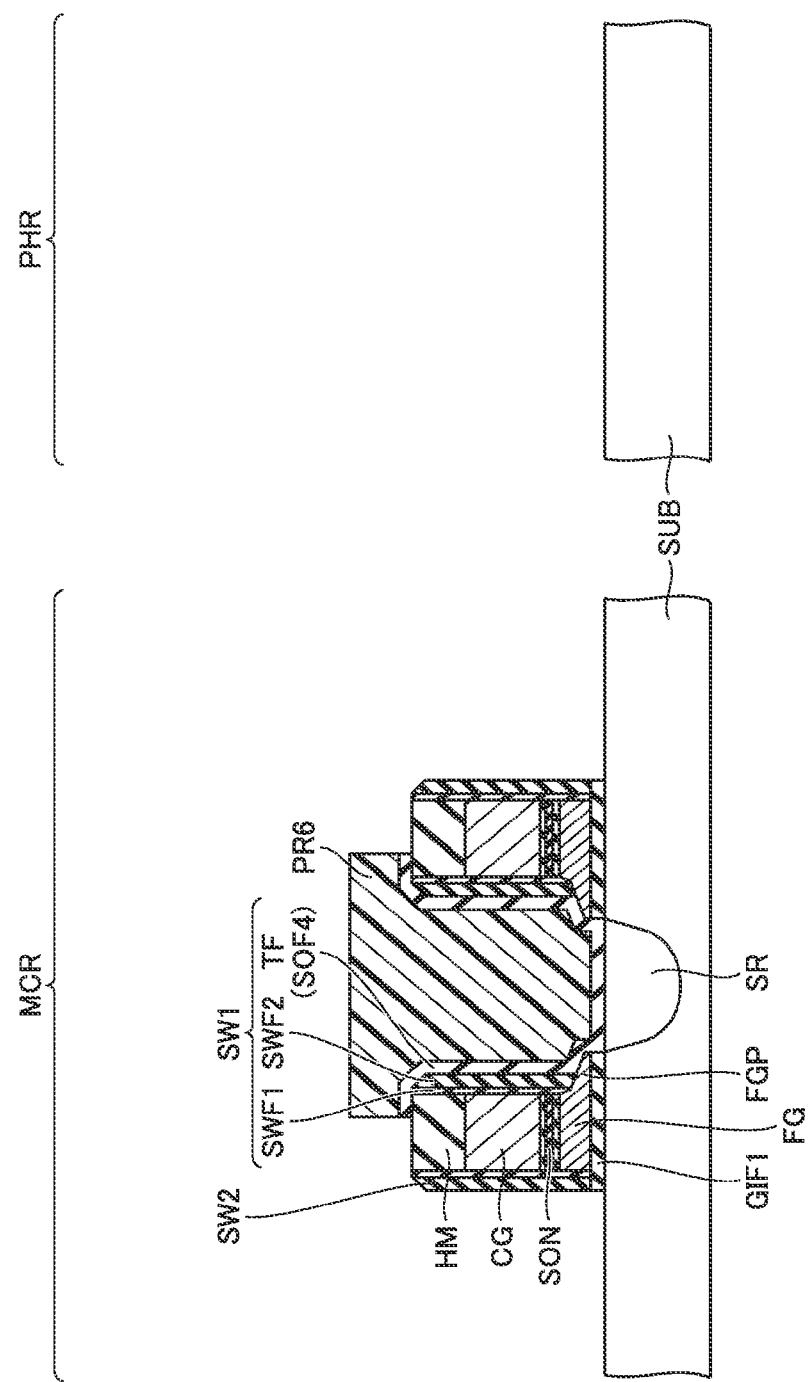
FIG. 17 is a cross-sectional view showing a step performed after the step shown in FIG. 16 in the same embodiment.

Then, as shown in FIG. 16, a silicon oxide film SOF4 which becomes a tunnel oxide film is formed by a CVD process, for example. Then, as shown in FIG. 17, a prescribed photolithography process is performed to form a photoresist pattern PR6 covering a portion of silicon oxide film SOF4 on the side where protruding portion FGP of floating gate electrode FG is located and exposing the other portions of silicon oxide film SOF4.

Then, an etching process is performed with photoresist pattern PR6 as an etching mask, to remove exposed silicon oxide film SOF4 and silicon oxide film TOF1 located immediately therebelow. A portion of silicon oxide film TOF1 located immediately below floating gate electrode FG becomes gate insulating film GIF1. Photoresist pattern PR6 is then removed.

Figure 18:
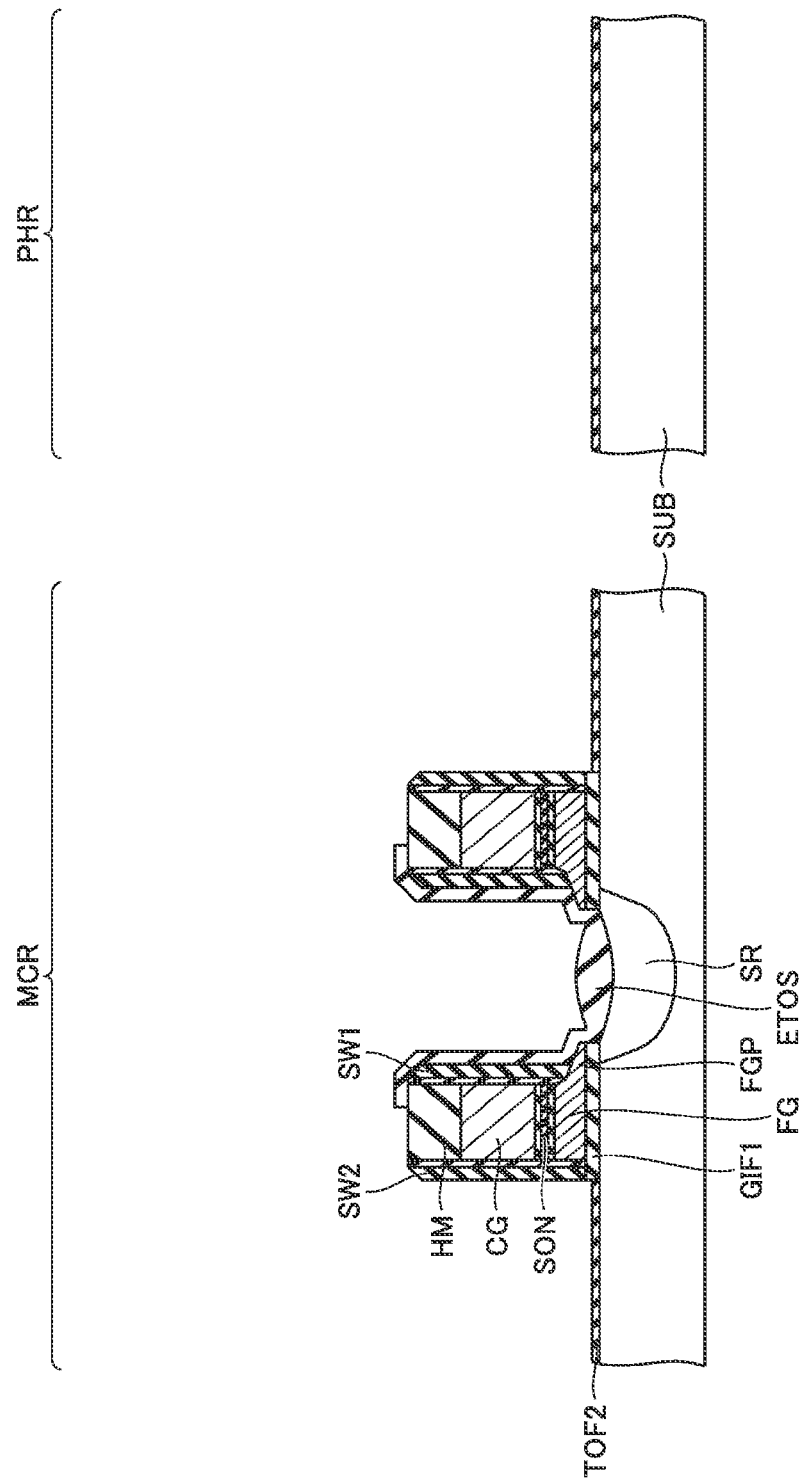
FIG. 18 is a cross-sectional view showing a step performed after the step shown in FIG. 17 in the same embodiment.

Then, as shown in FIG. 18, a thermal oxidation process is performed to form a silicon oxide film TOF2 on the surface of exposed semiconductor substrate SUB. Silicon oxide film TOF2 becomes gate insulating film GIF2 (see FIG. 2) of select gate electrode WG. Here, in source region SR, enhanced oxidation occurs in the surface of source region SR owing to the arsenic implantation, so that silicon oxide film SOF4 becomes silicon oxide film ETOS having a greater film thickness.

Figure 19:
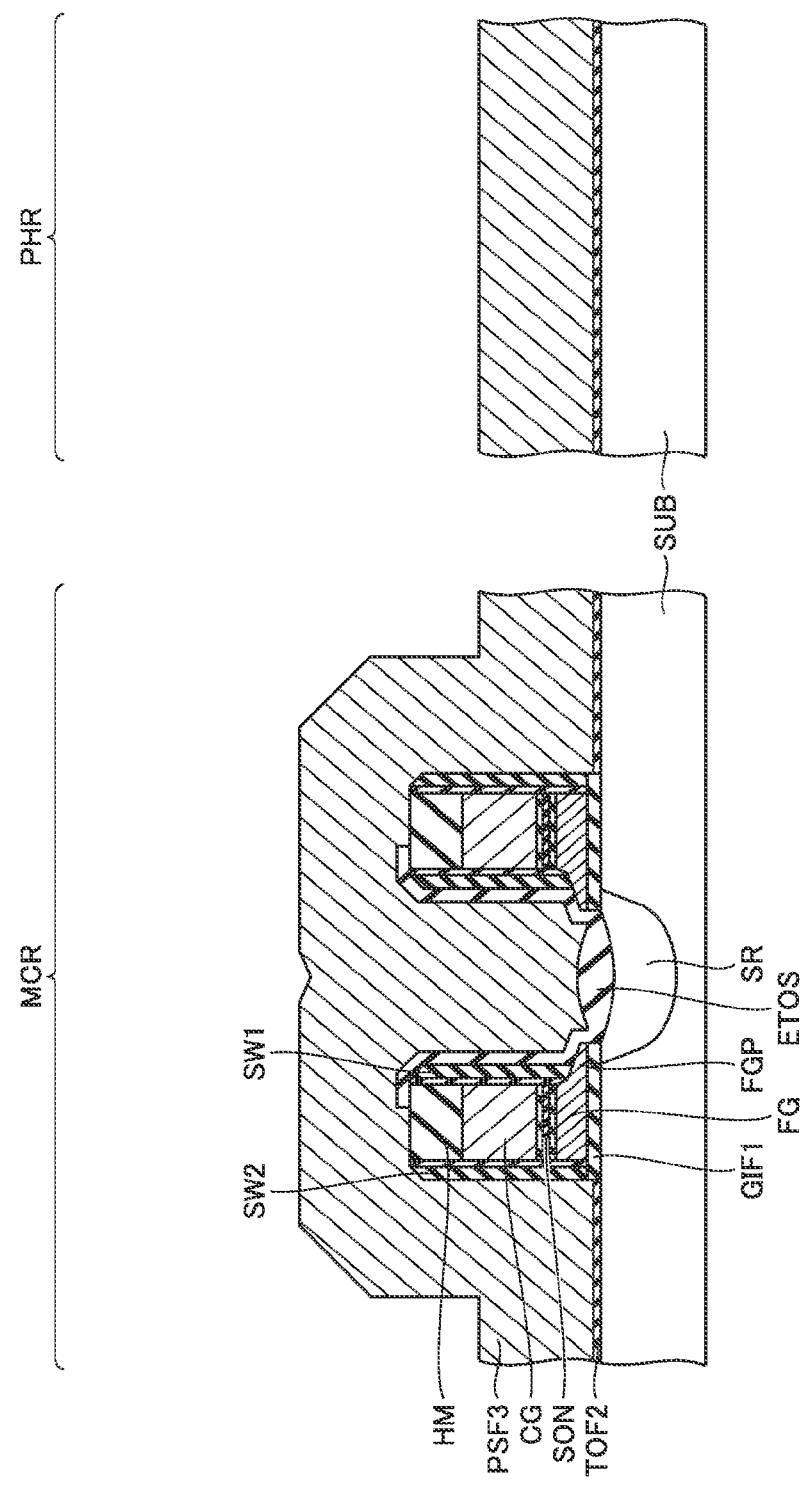
FIG. 19 is a cross-sectional view showing a step performed after the step shown in FIG. 18 in the same embodiment.
Figure 20:
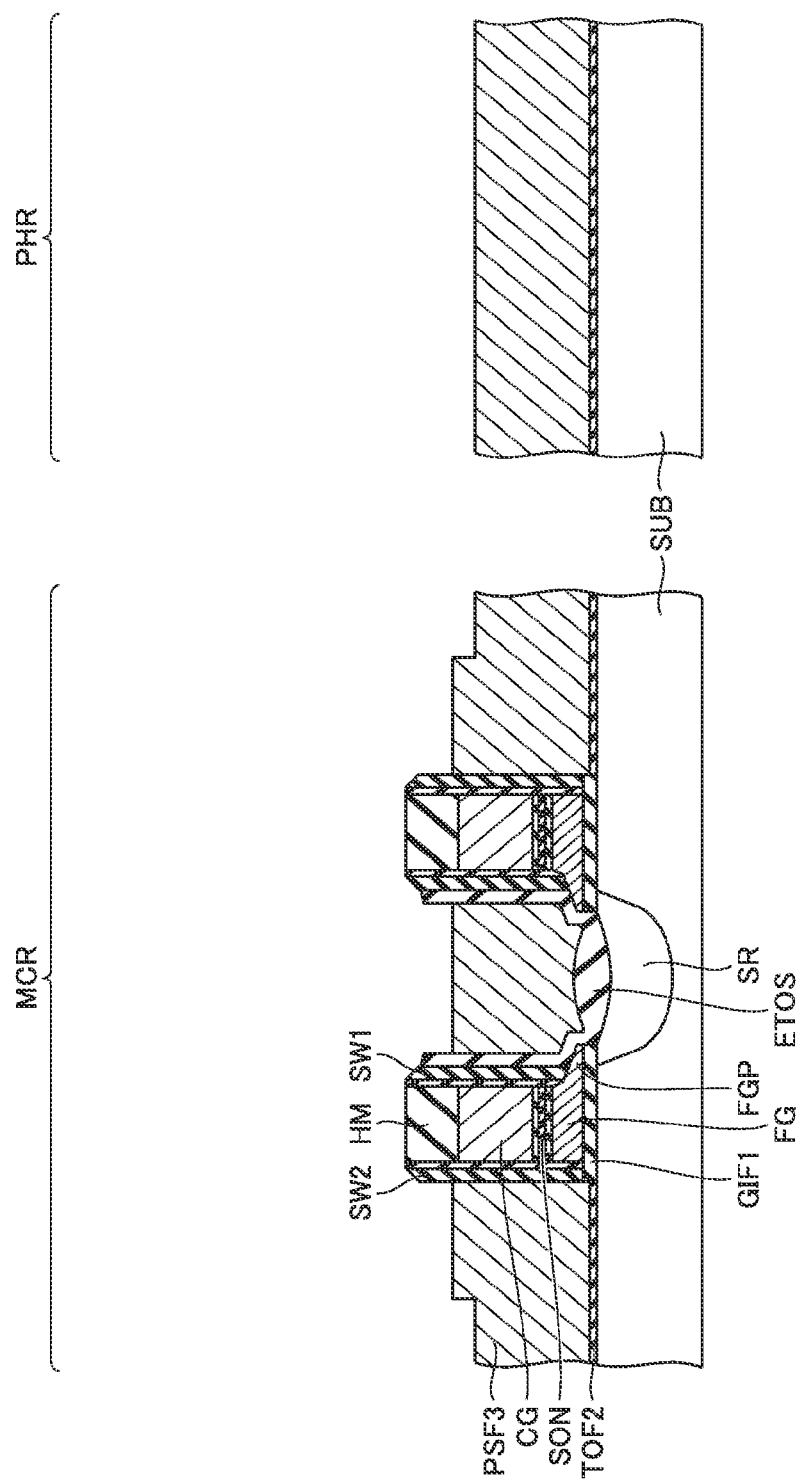
FIG. 20 is a cross-sectional view showing a step performed after the step shown in FIG. 19 in the same embodiment.

Then, as shown in FIG. 19, a polysilicon film PSF3 is formed by a CVD process, for example, to cover memory cell region MCR and peripheral circuit region PHR. Then, a chemical mechanical polishing process and an etching process are performed on polysilicon film PSF3. Consequently, as shown in FIG. 20, polysilicon film PSF3 is planarized so as to expose silicon nitride film HM located immediately above control gate electrode CG.

Figure 21:
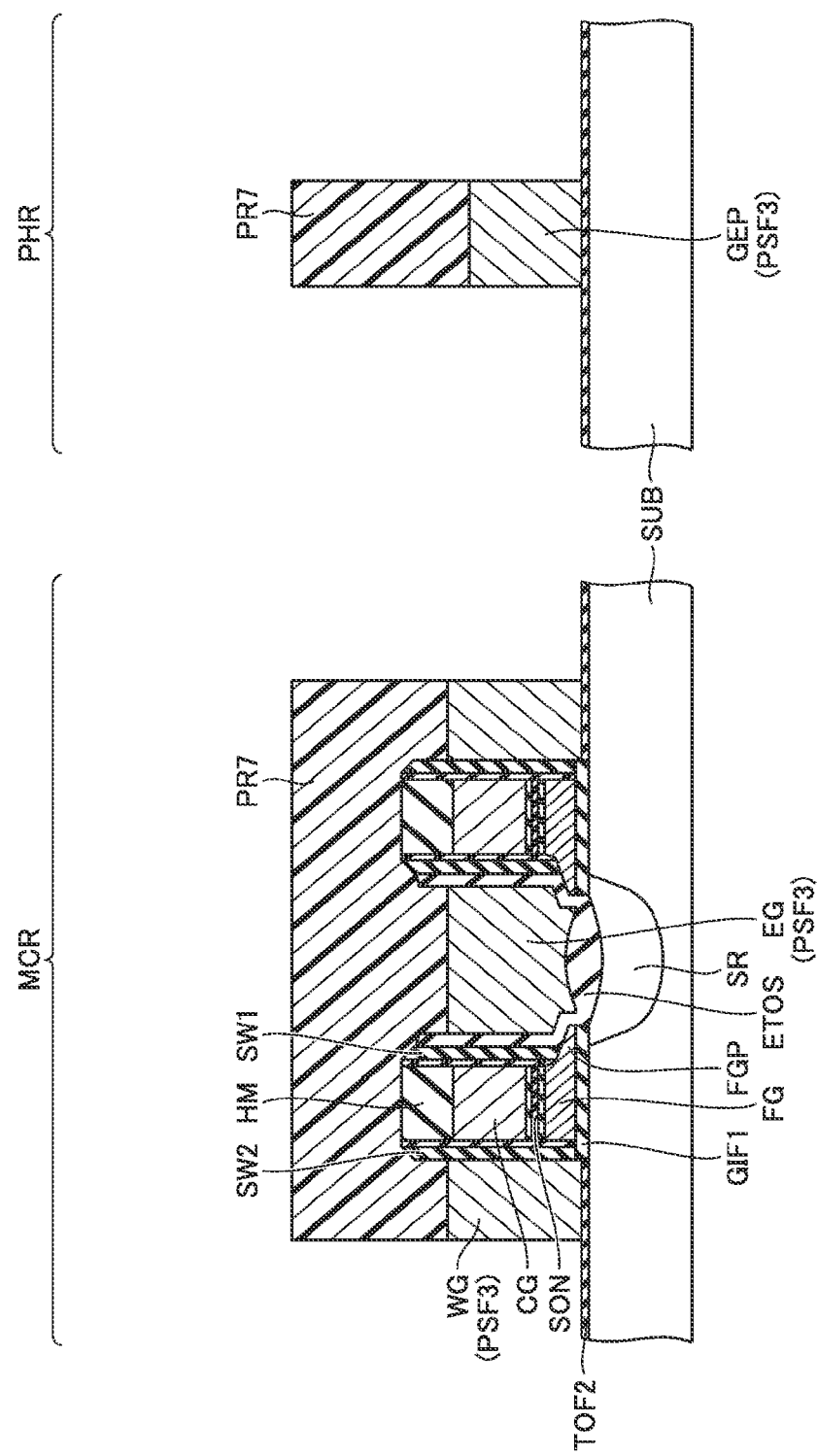
FIG. 21 is a cross-sectional view showing a step performed after the step shown in FIG. 20 in the same embodiment.

Then, as shown in FIG. 21, a prescribed photolithography process is performed to form a photoresist pattern PR7. Then, an etching process is performed with photoresist pattern PR7 as an etching mask. Consequently, select gate electrode WG and erase gate electrode EG are formed in memory cell region MCR. Gate electrode GEP of the peripheral transistor is formed in peripheral circuit region PHR. Photoresist pattern PR7 is then removed.

Then, a prescribed implantation process is performed to form drain region DR in memory cell region MCR (see FIG. 2), and form source/drain region SDR in peripheral circuit region PHR (see FIG. 2). Subsequently, liner film LF, interlayer insulating film ILF and the like covering memory cell region MCR and peripheral circuit region PHR are formed, and furthermore, contact plugs CPG, a multilayer wiring structure MHS (both shown in FIG. 2) and the like are formed, to thereby complete the substantial part of the semiconductor device.

Figure 22:
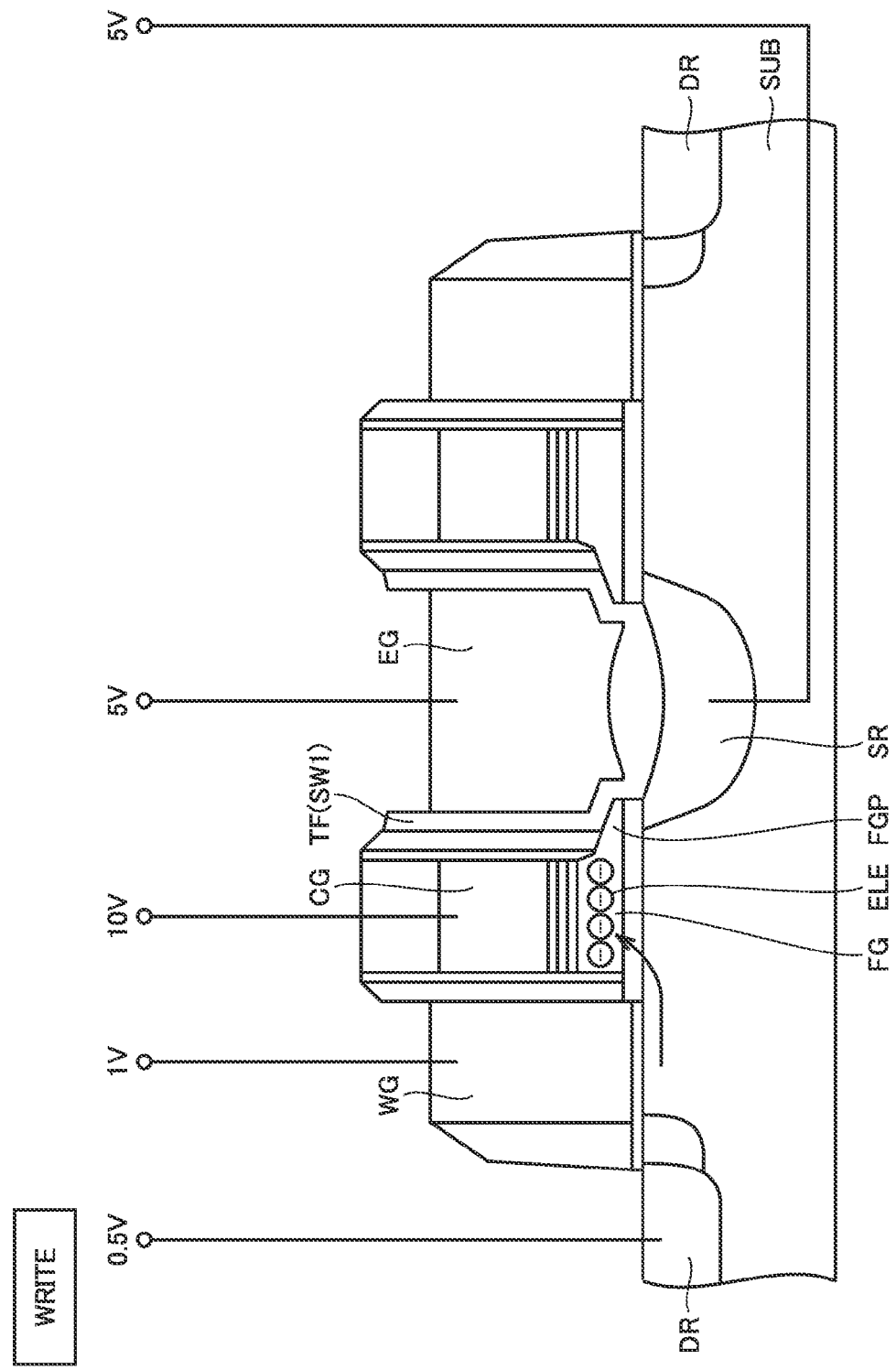
FIG. 22 is a cross-sectional view to illustrate write operation to the flash memory in the semiconductor device in the same embodiment.

Next, the operation of the flash memory in the above-discussed semiconductor device is described. Write operation is described first. As shown in FIG. 22, for example, a voltage of 5 V is applied to source region SR, a voltage of 10 V is applied to control gate electrode CG, a voltage of 1 V is applied to select gate electrode WG, and a voltage of 0.5 V is applied to drain region DR. Consequently, electrons ELE as information are injected into floating gate electrode FG (see the arrow). This process is referred to as source-side injection.

Figure 23:
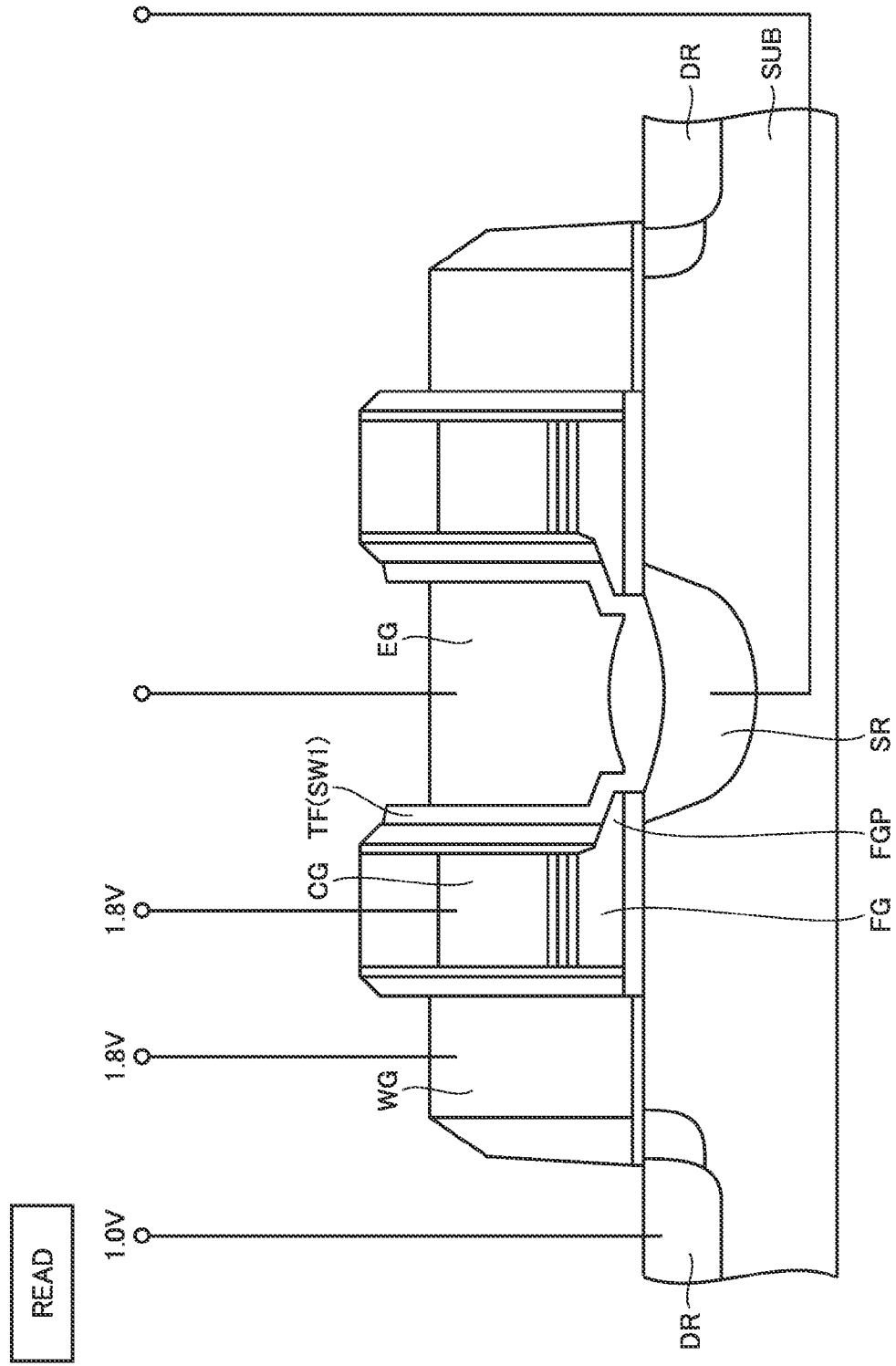
FIG. 23 is a cross-sectional view to illustrate read operation from the flash memory in the semiconductor device in the same embodiment.

Read operation is described next. As shown in FIG. 23, for example, a voltage of 1.8 V is applied to control gate electrode CG, a voltage of 1.8 V is applied to select gate electrode WG, and a voltage of 1.0 V is applied to drain region DR. On this occasion, if the electrons have been stored in floating gate electrode FG (written state), very little current flows from drain region DR to source region SR. If the electrons have not been stored in floating gate electrode FG (erased state), on the other hand, a current flows from drain region DR to source region SR. It is determined whether or not the electrons (information) have been stored in floating gate electrode FG based on whether or not this current (read current) is detected.

Figure 24:
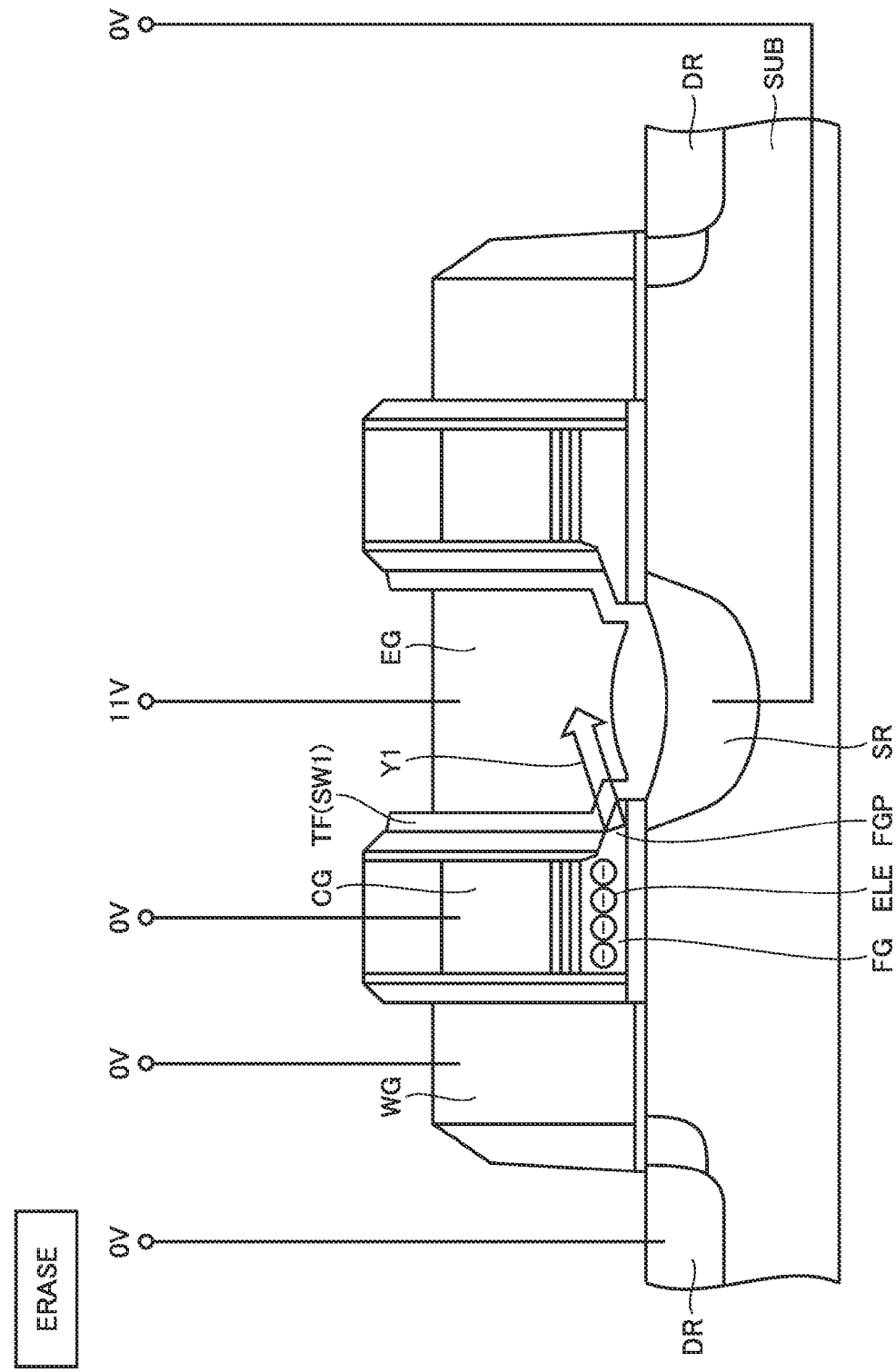
FIG. 24 is a cross-sectional view to illustrate erase operation of the flash memory in the semiconductor device in the same embodiment.

Erase operation is described next. As shown in FIG. 24, for example, a voltage of 11 V is applied to erase gate electrode EG. On this occasion, in floating gate electrode FG where electrons ELE have been stored, electrons ELE are drawn into erase gate electrode EG through tunnel oxide film TF, thus erasing the information.

In floating gate electrode FG of the flash memory of the above-discussed semiconductor device, the information erasure can be reliably effected since protruding portion FGP protruding toward erase gate electrode EG has end face FGE of a height corresponding to thickness THT and inclined surface CS, and protrudes for a prescribed length. This will be described in comparison with semiconductor devices (flash memories) according to comparative examples.

Figure 25:
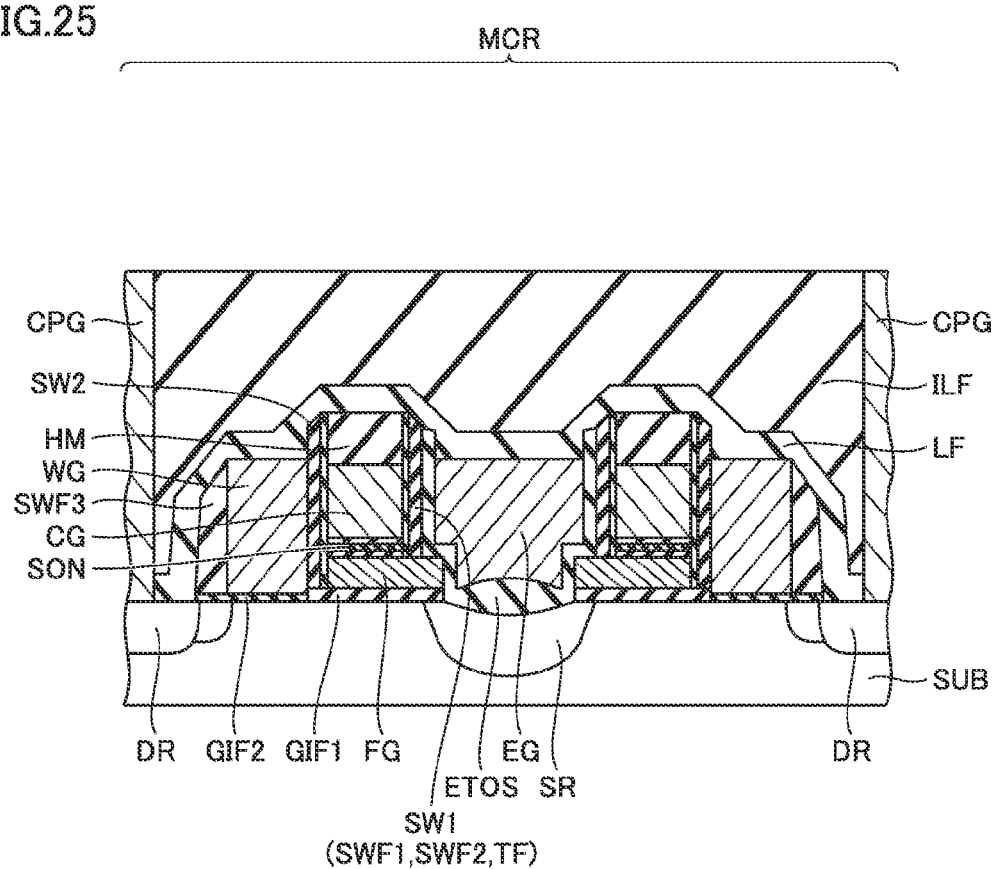
FIG. 25 is a cross-sectional view of a flash memory in a semiconductor device according to a first comparative example.

First, a semiconductor device according to a first comparative example is described. As shown in FIG. 25, in floating gate electrode FG of the flash memory cell, a protruding portion protruding toward erase gate electrode EG is formed to have a certain thickness. The protruding portion faces erase gate electrode EG with tunnel oxide film TF interposed therebetween. The remaining configuration is similar to that of the semiconductor device shown in FIG. 2, and thus the same members are designated by the same characters and the description thereof will not be repeated unless necessary.

Figure 26:
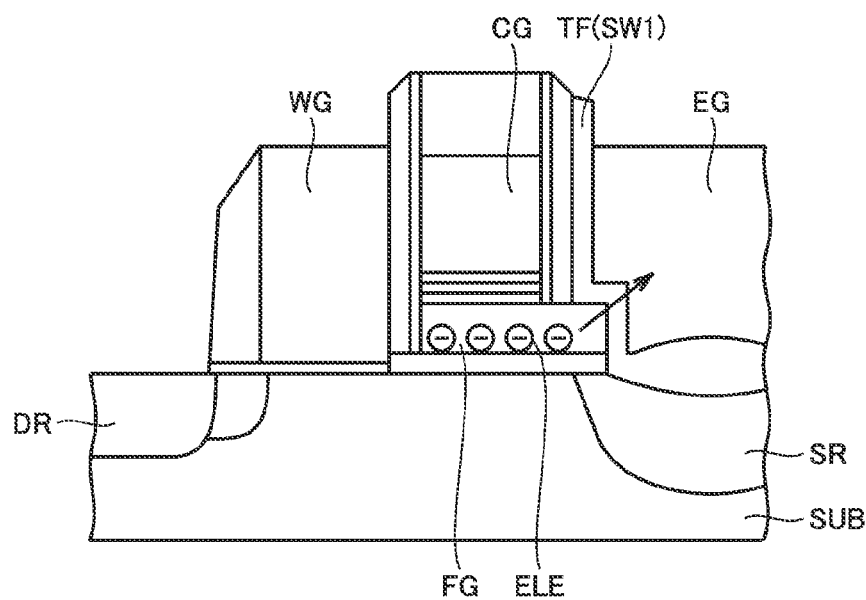
FIG. 26 is a fragmentary cross-sectional view to illustrate erase operation of the flash memory in the semiconductor device according to the first comparative example.

Next, erase operation of the semiconductor device (flash memory) according to the first comparative example is described. As shown in FIG. 26, information is erased by applying a prescribed voltage to erase gate electrode EG to draw electrons ELE stored in floating gate electrode FG into erase gate electrode EG through the tunnel oxide film.

In the flash memory, floating gate electrode FG has capacitive coupling to each of control gate electrode CG, select gate electrode WG, semiconductor substrate SUB and erase gate electrode EG. The smaller the capacitive coupling (capacitance A) between floating gate electrode FG and erase gate electrode EG, the more likely it is that an electric field will be applied between floating gate electrode FG and erase gate electrode EG by another capacitive coupling.

In order to improve the performance of erase operation of drawing the electrons stored in floating gate electrode FG into erase gate electrode EG, therefore, it is required to reduce capacitance A. Methods of reducing capacitance A include a method of reducing the area where floating gate electrode FG and erase gate electrode EG face each other.

Figure 27:
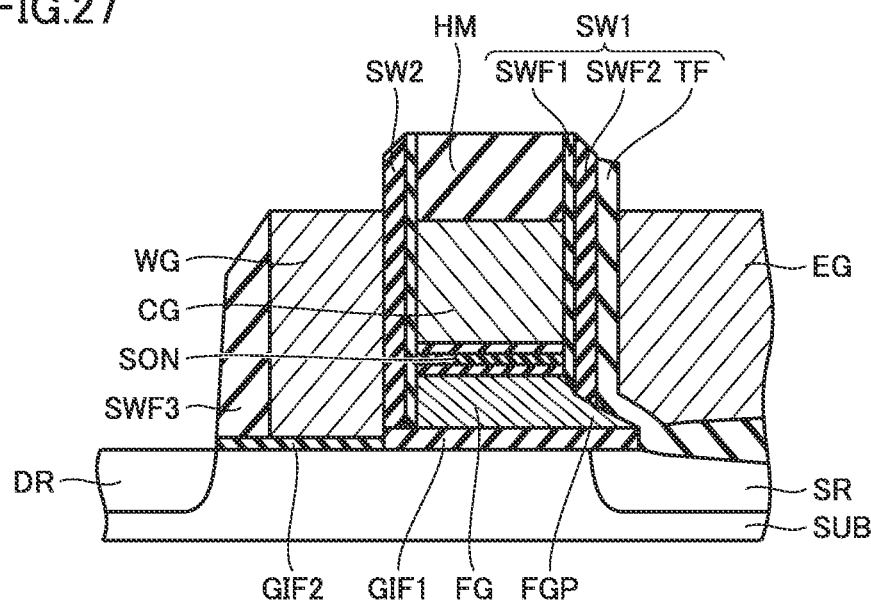
FIG. 27 is a cross-sectional view of a flash memory in a semiconductor device according to a second comparative example.

Thus, as a second comparative example, a semiconductor device with a reduced facing area between floating gate electrode FG and erase gate electrode EG is described. As shown in FIG. 27, floating gate electrode FG is provided with protruding portion FGP protruding toward erase gate electrode EG. Protruding portion FGP has a pointed tip. The remaining configuration is similar to that of the semiconductor device shown in FIG. 2, and thus the same members are designated by the same characters and the description thereof will not be repeated unless necessary.

In the semiconductor device according to the second comparative example, the inclined surface of protruding portion FGP faces erase gate electrode EG owing to the pointed tip of protruding portion FGP of floating gate electrode FG, so that capacitance A can be made smaller than in the first comparative example. Accordingly, faster erase operation can be effected.

In the semiconductor device according to the second comparative example, floating gate electrode FG having protruding portion FGP with a pointed tip is formed by performing a dry etching process on a polysilicon film which becomes the floating gate electrode. On this occasion, variation in the dry etching process causes variation in the amount of recess (etched amount) of the polysilicon film which becomes the floating gate electrode. This may cause variation in overlap length as seen in plan view between the protruding portion of the patterned floating gate electrode and the erase gate electrode.

Figure 28:
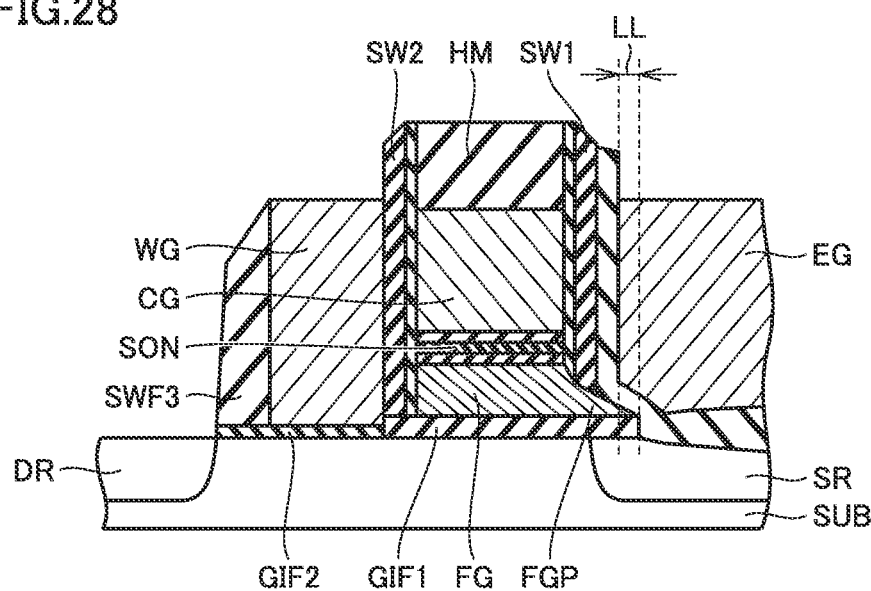
FIG. 28 is a cross-sectional view showing an example of variation associated with manufacture in the flash memory in the semiconductor device according to the second comparative example.
Figure 29:
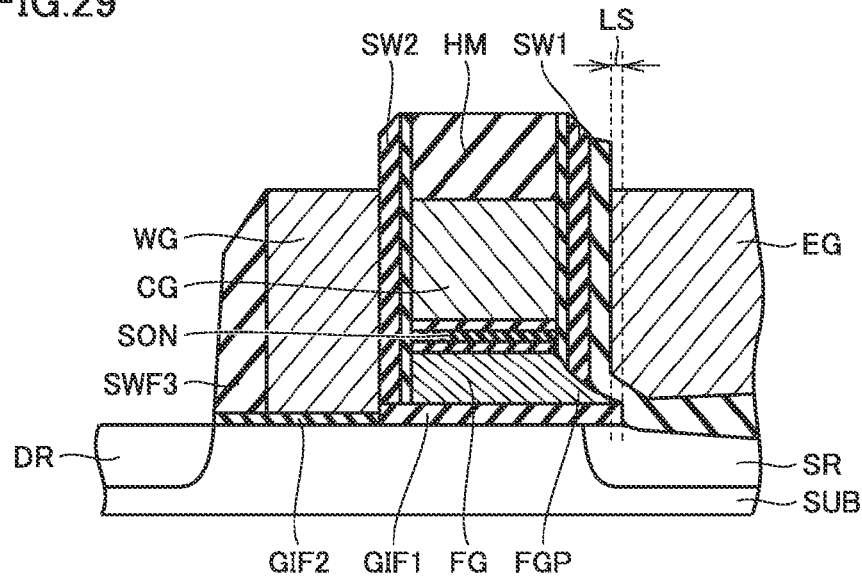
FIG. 29 is a cross-sectional view showing another example of variation associated with manufacture in the flash memory in the semiconductor device according to the second comparative example.

As shown in FIG. 28, when the amount of recess of the polysilicon film is relatively small, the overlap length as seen in plan view between protruding portion FGP of floating gate electrode FG and erase gate electrode EG is relatively long, which is a length LL. As shown in FIG. 29, when the amount of recess of the polysilicon film is relatively large, on the other hand, the overlap length as seen in plan view between protruding portion FGP of floating gate electrode FG and erase gate electrode EG is relatively short, which is a length LS. Variation in the overlap length results in variation in the facing area between floating gate electrode FG and erase gate electrode EG, resulting in variation in the performance of erase operation.

Figure 30:
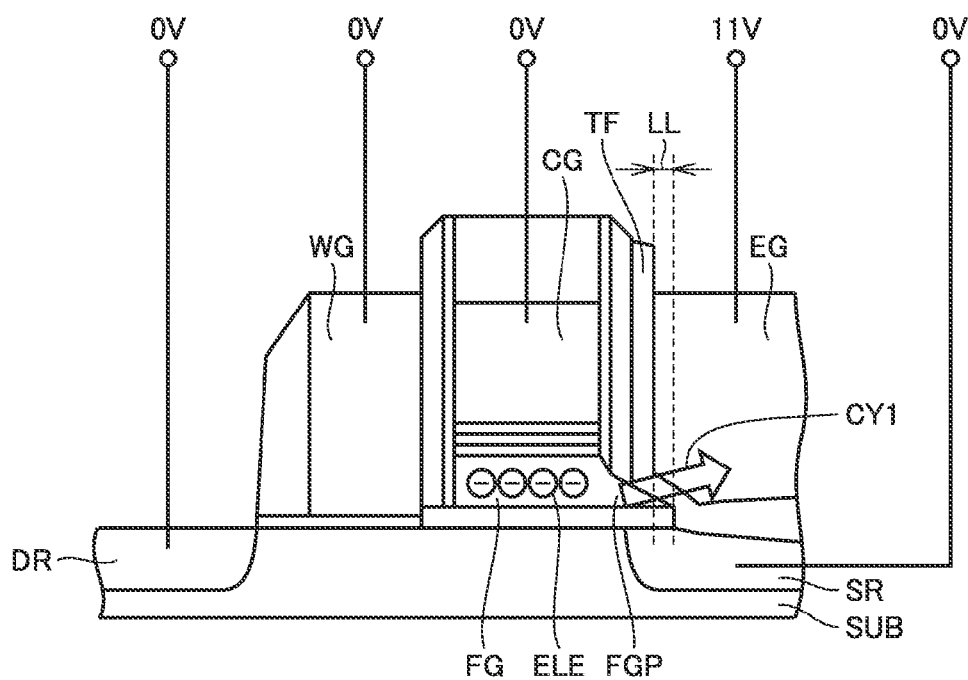
FIG. 30 is a cross-sectional view to illustrate erase operation in the example shown in FIG. 28 in the flash memory in the semiconductor device according to the second comparative example.
Figure 31:
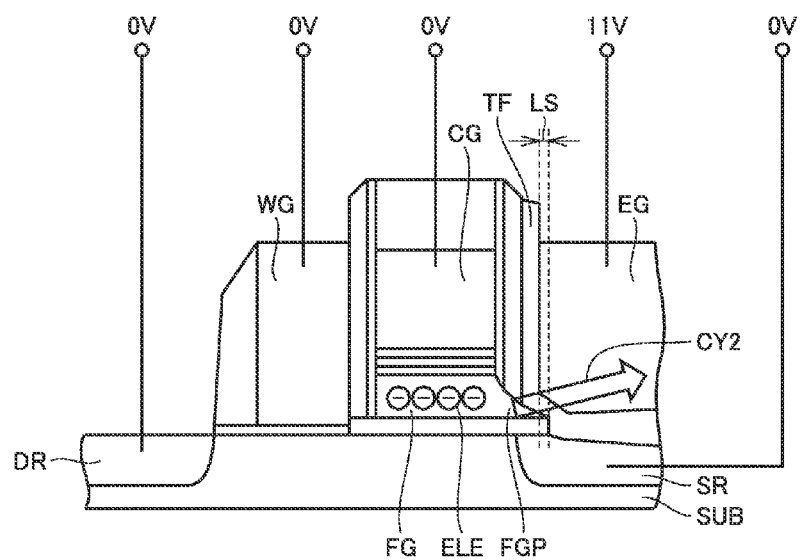
FIG. 31 is a cross-sectional view to illustrate erase operation in another example shown in FIG. 29 in the flash memory in the semiconductor device according to the second comparative example.

As shown in FIG. 30, when the overlap length is relatively long (length LL), the electric field acting between floating gate electrode FG and erase gate electrode EG is relatively weak, and the speed at which electrons ELE are drawn into to erase gate electrode EG (arrow CY1) is relatively low. As shown in FIG. 31, when the overlap length is relatively short (length LS), on the other hand, the electric field acting between floating gate electrode FG and erase gate electrode EG is relatively strong, and the speed at which electrons ELE are drawn into to erase gate electrode EG (arrow CY2) is relatively high. In FIGS. 30 and 31, the difference in speed at which electrons ELE are drawn into to erase gate electrode EG is indicated by the lengths of arrows CY1 and CY2, where the longer arrow indicates the higher speed.

It has been reported that, if the overlap length is further reduced, the speed at which electrons ELE are drawn into erase gate electrode EG conversely decreases gradually (Patent Document 2 (Japanese Patent Laying-Open No. 2003-124360)). Thus, the erase characteristics are degraded if the overlap length is too long or too short. It is required that the overlap length be set within a desired range of overlap length (facing area).

In contrast to the semiconductor device according to the second comparative example, in the semiconductor device according to the first embodiment, an etching process is performed on polysilicon film PSF1 so as to leave the prescribed film thickness (film thickness THC) based on the etching time calculated from the data on the previously measured film thickness of polysilicon film PSF1.

In addition, an etching process is performed on remaining polysilicon film PSF1, with silicon oxide film SWF1, silicon nitride film SWF2 and silicon oxide film SOF3 covering the side surface of control gate electrode CG and the like (see FIG. 14) as an etching mask.

Accordingly, first of all, the tip of protruding portion FGP of floating gate electrode FG is prevented from becoming pointed due to the etching process on polysilicon film PSF1, leading to the formation of protruding portion FGP including end face FGE of a height corresponding to remaining thickness THT (see FIG. 3) and inclined surface CS continuous with end face FGE (see FIG. 3). Furthermore, protruding portion FGP protrudes from the side surface of control gate electrode CG for length LP corresponding to the thicknesses of silicon oxide film SOF3 and the like (see FIG. 14).

Consequently, the variation in the overlap length (facing area) as seen in plan view between protruding portion FGP of floating gate electrode FG and erase gate electrode EG is reliably suppressed, leading to substantially uniform strength of the electric field acting between floating gate electrode FG and erase gate electrode EG in memory cell region MCR or in semiconductor substrate SUB during information erasure. As a result, as shown in FIG. 24, electrons ELE stored in floating gate electrode FG can be reliably drawn into erase gate electrode EG at the substantially same speed (arrow Y1), thereby improving the erase characteristics.

Second Embodiment

Figure 32:
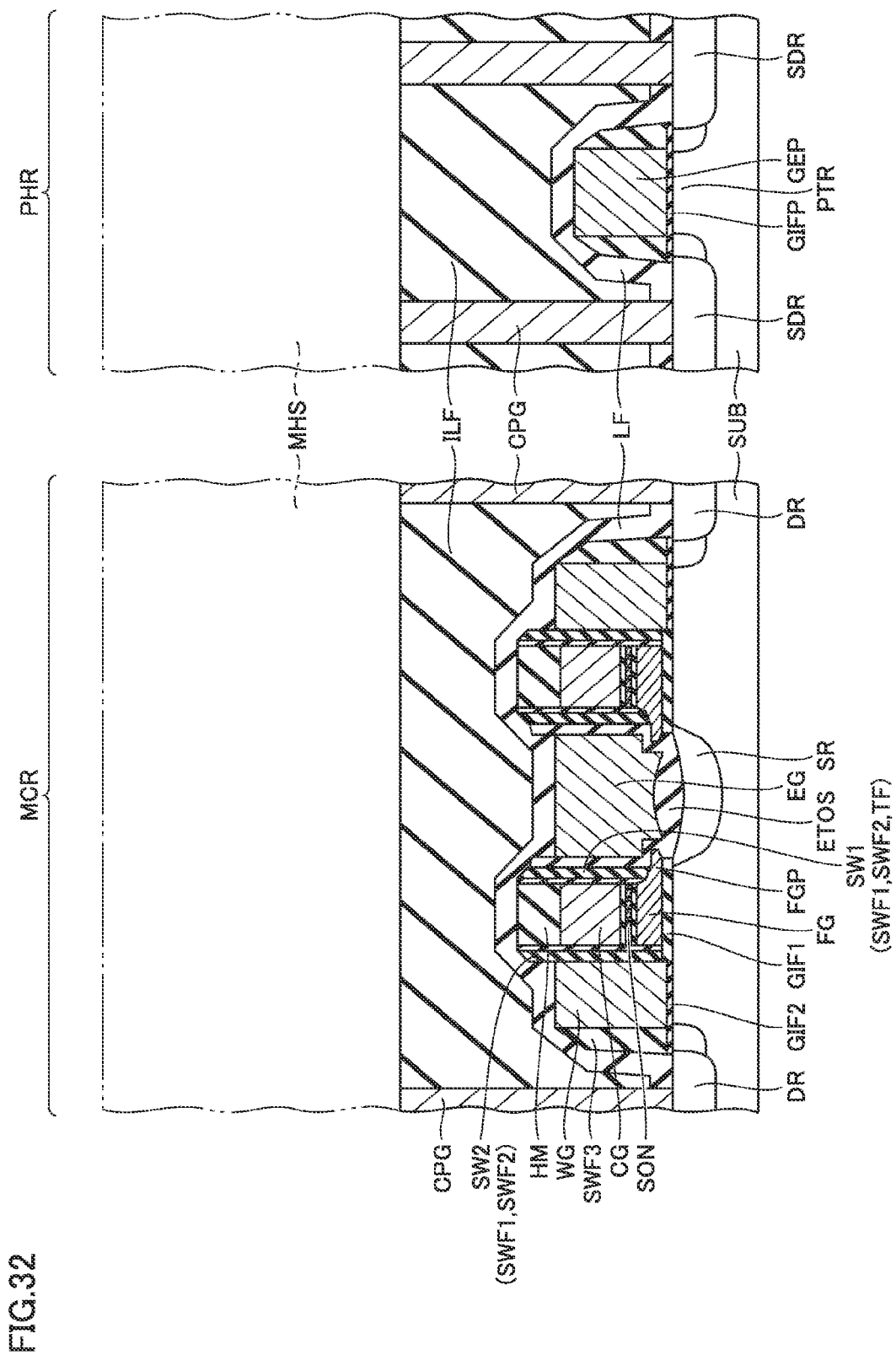
FIG. 32 is a cross-sectional view of a memory cell region and a peripheral circuit region in a semiconductor device according to a second embodiment.

A semiconductor device including a flash memory according to a second embodiment is described. As shown in FIG. 32, in memory cell region MCR, floating gate electrode FG is formed on semiconductor substrate SUB with gate insulating film GIF1 interposed therebetween. Control gate electrode CG is formed on floating gate electrode FG with laminated insulating film SON interposed therebetween. Erase gate electrode EG is formed on one side surface of control gate electrode CG and the like, with sidewall insulating film SW1 interposed therebetween. Erase gate electrode EG is also formed on semiconductor substrate SUB with silicon oxide film ETOS interposed therebetween.

Figure 33:
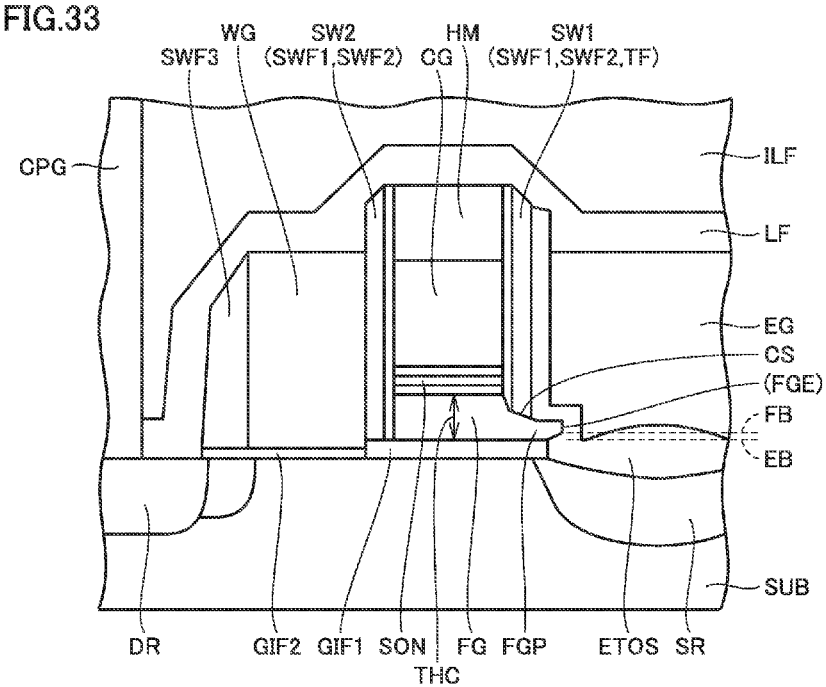
FIG. 33 is a fragmentary enlarged cross-sectional view showing a floating gate electrode and its peripheral structure in the same embodiment.

The structure of floating gate electrode FG is described in further detail. As shown in FIG. 33, floating gate electrode FG includes protruding portion FGP protruding toward erase gate electrode EG so as to flare from a portion located immediately below control gate electrode CG. Protruding portion FGP includes end face FGE of a height corresponding to thickness THT, and inclined surface CS continuous with end face FGE. Thickness THT is preferably about 10 to 20 nm. Protruding portion FGP faces erase gate electrode EG with tunnel oxide film TF interposed therebetween.

In the semiconductor device according to the second embodiment, particularly, the position of a lower end of erase gate electrode EG (see a dotted line EB) is lower than the position of a lower end of the tip portion of protruding portion FGP (see a dotted line FB). The remaining configuration is similar to that of the semiconductor device shown in FIGS. 2 and 3, and thus the same members are designated by the same characters and the description thereof will not be repeated unless necessary.

Figure 34:
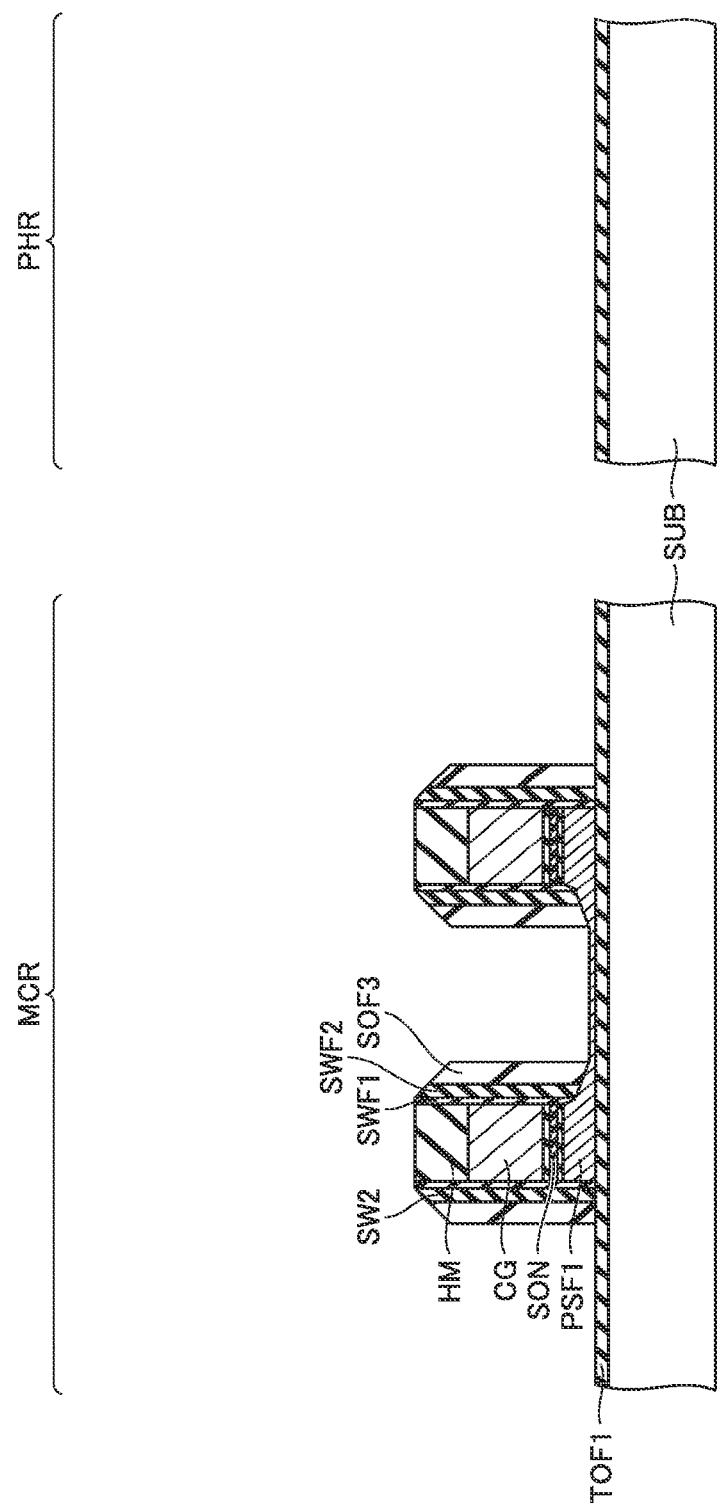
FIG. 34 is a cross-sectional view showing a step of a method of manufacturing the semiconductor device in the same embodiment.
Figure 35:
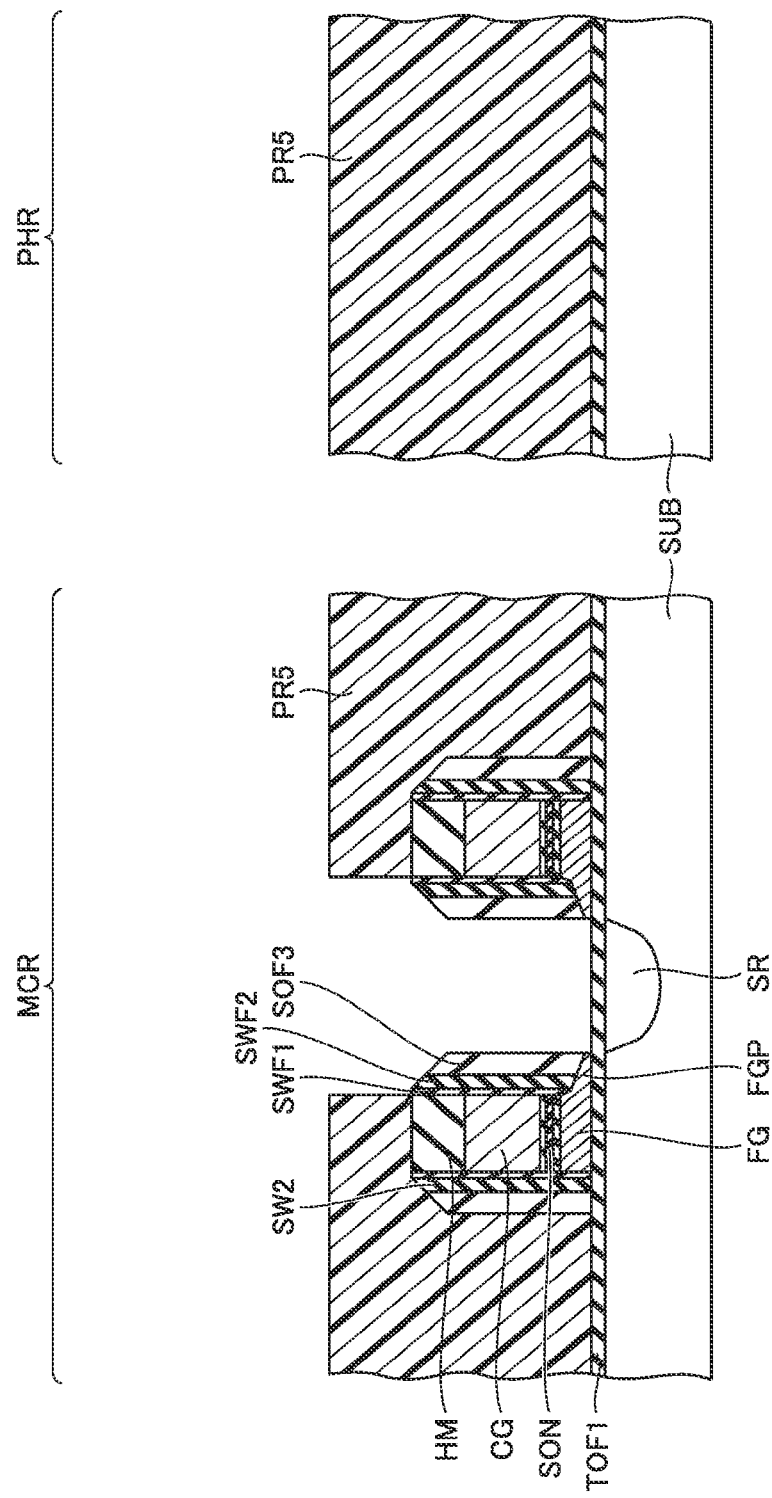
FIG. 35 is a cross-sectional view showing a step performed after the step shown in FIG. 34 in the same embodiment.

Next, a method of manufacturing the above-discussed semiconductor device is described. First, similar steps to the steps shown in FIGS. 4 to 13 are performed to form silicon oxide film SOF3 to cover silicon nitride film SWF2, as shown in FIG. 34. Then, as shown in FIG. 35, a prescribed photolithography process is performed to form photoresist pattern PR5. Photoresist pattern PR5 is formed to expose the flaring side of polysilicon film PSF1. Then, a dry etching process is performed with photoresist pattern PR5 as an etching mask, to remove exposed polysilicon film PSF1 and form floating gate electrode FG.

Then, an impurity of a prescribed conductivity type (arsenic, for example) is implanted with photoresist pattern PR5 as an implantation mask, to form source region SR. On this occasion, for example, the arsenic is implanted at a dose of about $2 \times 10^{15}/cm^2$ to $5 \times 10^{15}/cm^2$. The value of this dose is set to be higher than that of the dose for the semiconductor device described above (see FIG. 14).

Figure 36:
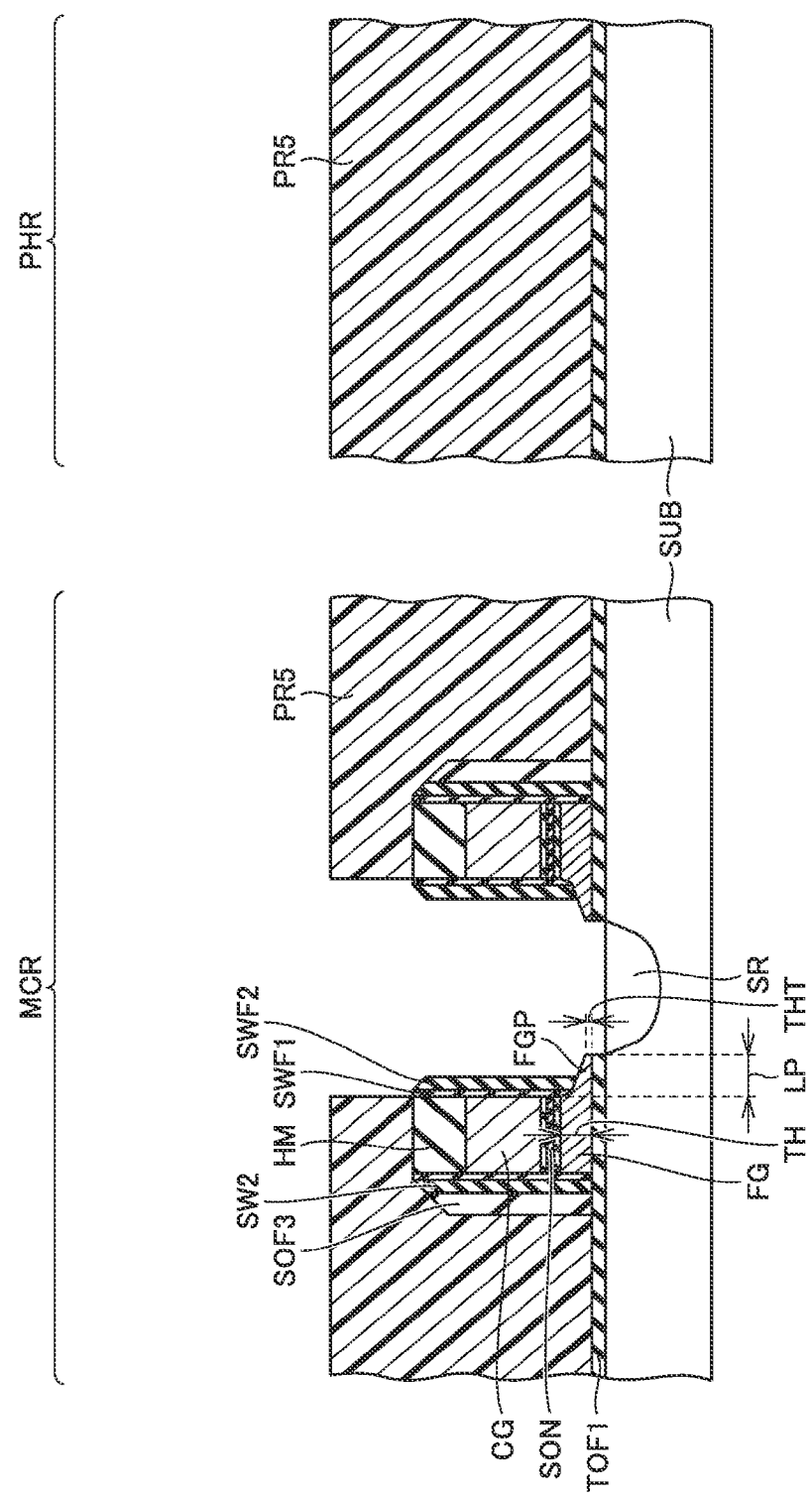
FIG. 36 is a cross-sectional view showing a step performed after the step shown in FIG. 35 in the same embodiment.

Then, a wet etching process is performed with photoresist pattern PR5 as an etching mask, to remove exposed silicon oxide film SOF3 and silicon oxide film TOF1. Consequently, as shown in FIG. 36, protruding portion FGP of floating gate electrode FG is exposed. Protruding portion FGP protrudes toward a region in which erase gate electrode EG (see FIG. 32) is to be located, so as to flare from a portion located immediately below control gate electrode CG.

Protruding portion FGP includes end face FGE of a height corresponding to thickness THT (see FIG. 33), and inclined surface CS continuous with end face FGE (see FIG. 33). Moreover, length LP of protruding portion FGP protruding from the side surface of control gate electrode CG corresponds to a combined thickness of silicon oxide film SWF1, silicon nitride film SWF2 and silicon oxide film SOF3 (see FIG. 36). Photoresist pattern PR5 is then removed.

Figure 37:
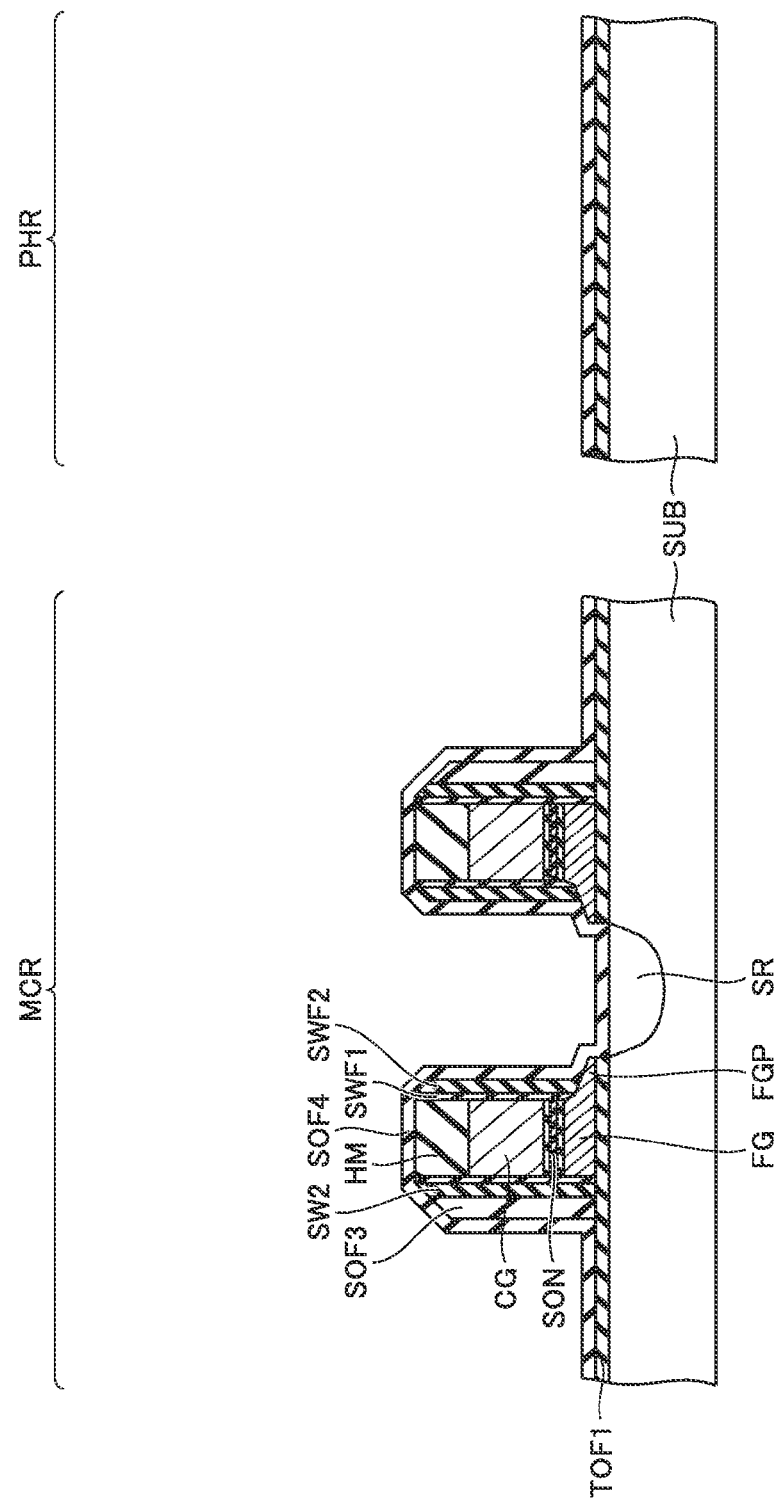
FIG. 37 is a cross-sectional view showing a step performed after the step shown in FIG. 36 in the same embodiment.
Figure 38:
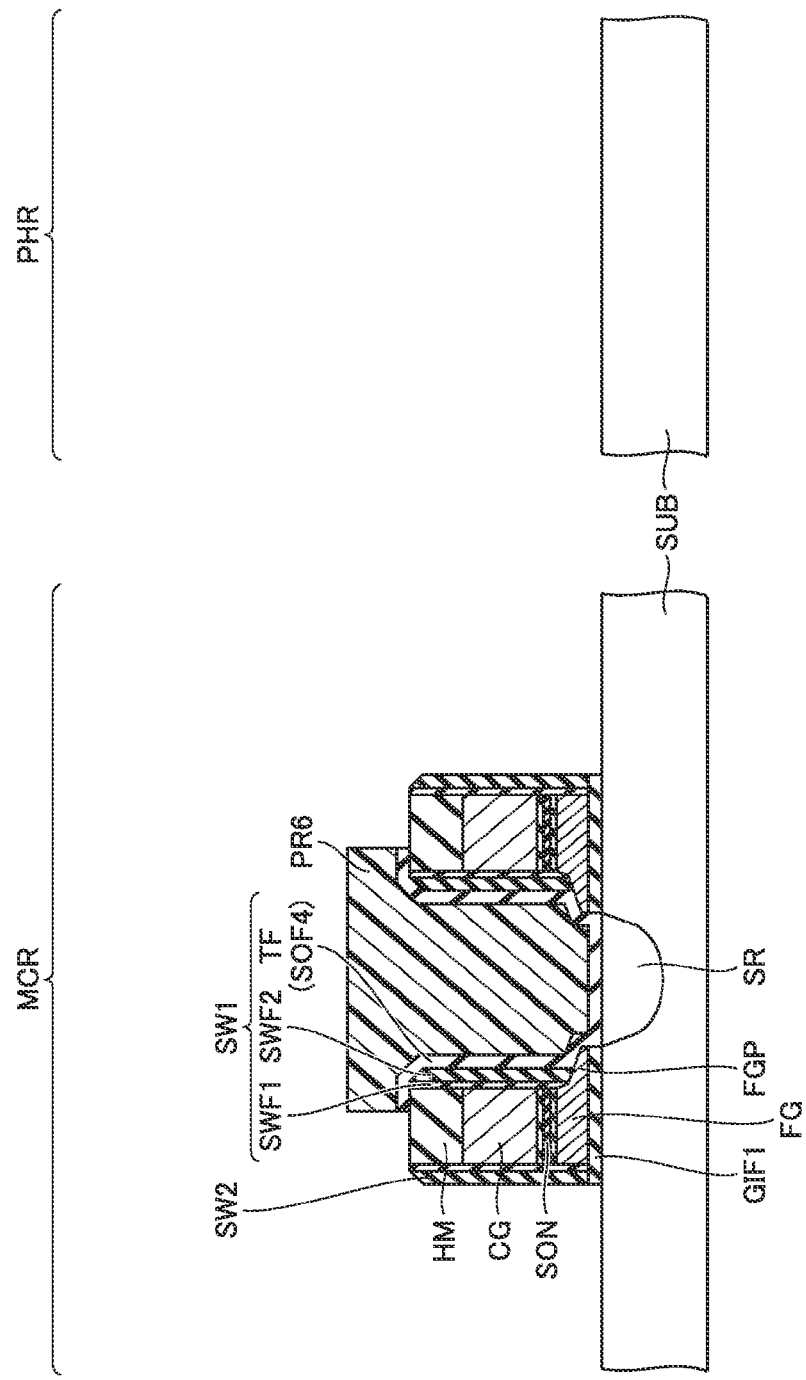
FIG. 38 is a cross-sectional view showing a step performed after the step shown in FIG. 37 in the same embodiment.

Then, as shown in FIG. 37, silicon oxide film SOF4 which becomes a tunnel oxide film is formed by a CVD process, for example. Then, as shown in FIG. 38, a prescribed photolithography process is performed to form photoresist pattern PR6 covering a portion of silicon oxide film SOF4 on the side where protruding portion FGP of floating gate electrode FG is located and exposing the other portions of silicon oxide film SOF4.

Then, an etching process is performed with photoresist pattern PR6 as an etching mask, to remove exposed silicon oxide film SOF4 and silicon oxide film TOF1 located immediately therebelow. A portion of silicon oxide film TOF1 located immediately below floating gate electrode FG becomes gate insulating film GIF1. Photoresist pattern PR6 is then removed.

Figure 39:
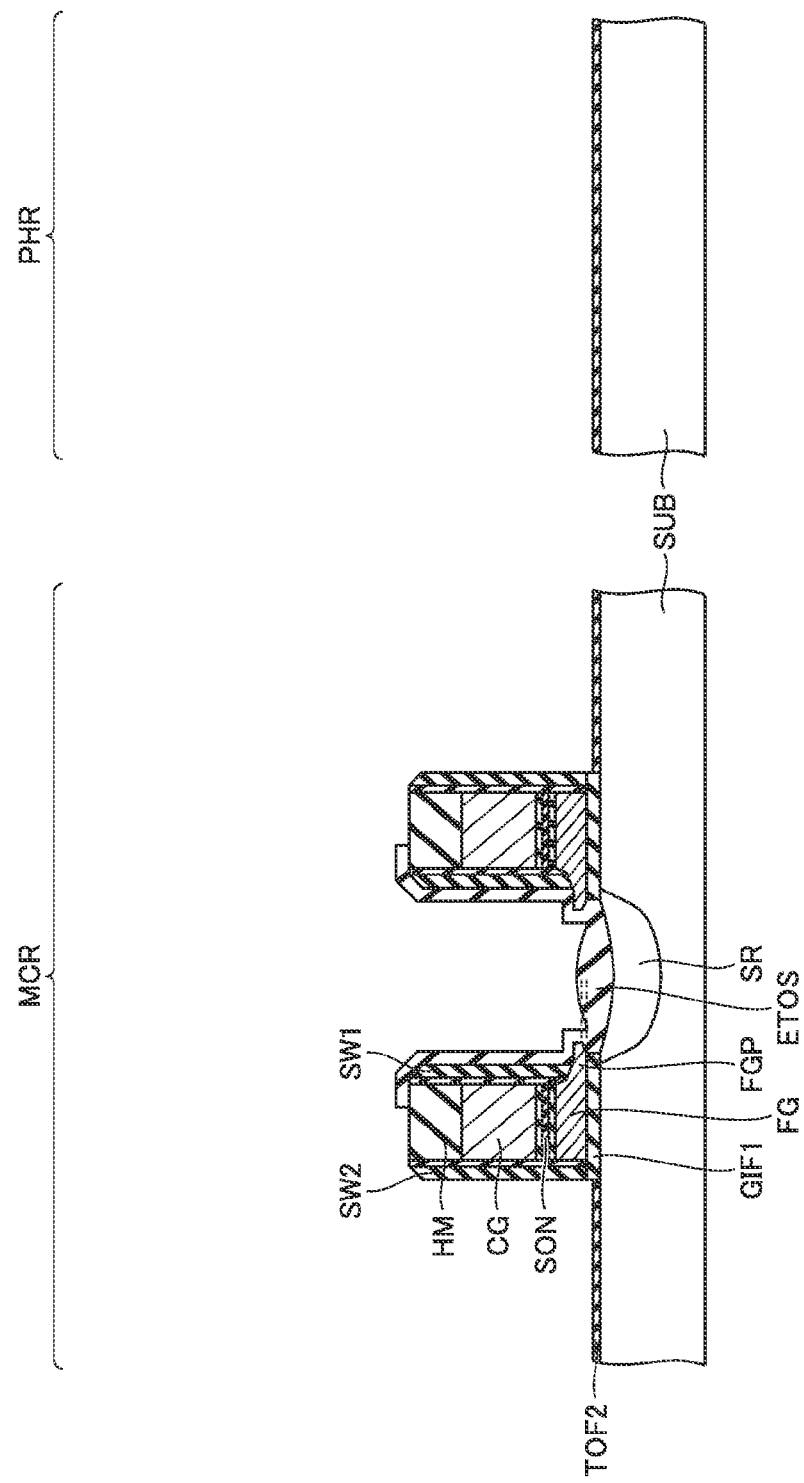
FIG. 39 is a cross-sectional view showing a step performed after the step shown in FIG. 38 in the same embodiment.

Then, as shown in FIG. 39, a thermal oxidation process is performed to form silicon oxide film TOF2 on the surface of exposed semiconductor substrate SUB. Silicon oxide film TOF2 becomes gate insulating film GIF2 of select gate electrode WG (see FIG. 32). Here, in source region SR, arsenic has been implanted at a dose higher than that for the semiconductor device described above. Accordingly, the enhanced oxidation progresses faster in the surface of source region SR, leading to the formation of silicon oxide film ETOS having a greater film thickness.

Particularly, in a portion of silicon oxide film SOF4 near protruding portion FGP, silicon oxide film ETOS grows like a bird's beak owing to the enhanced oxidation. Accordingly, protruding portion FGP of floating gate electrode FG is raised from below by silicon oxide film ETOS growing like a bird's beak.

Here, conditions for the enhanced oxidation are adjusted such that the lower end of protruding portion FGP is raised by the growth of the oxide film to a position higher than the lower end of the erase gate electrode which will be formed later (see the dotted lines). Methods of accelerating the enhanced oxidation include a method of increasing the concentration of an impurity to be implanted, and a method of setting relatively low implantation energy and increasing the impurity concentration at the surface of the semiconductor substrate, for example. An alternative method is to set relatively low temperature for the thermal oxidation process.

Figure 40:
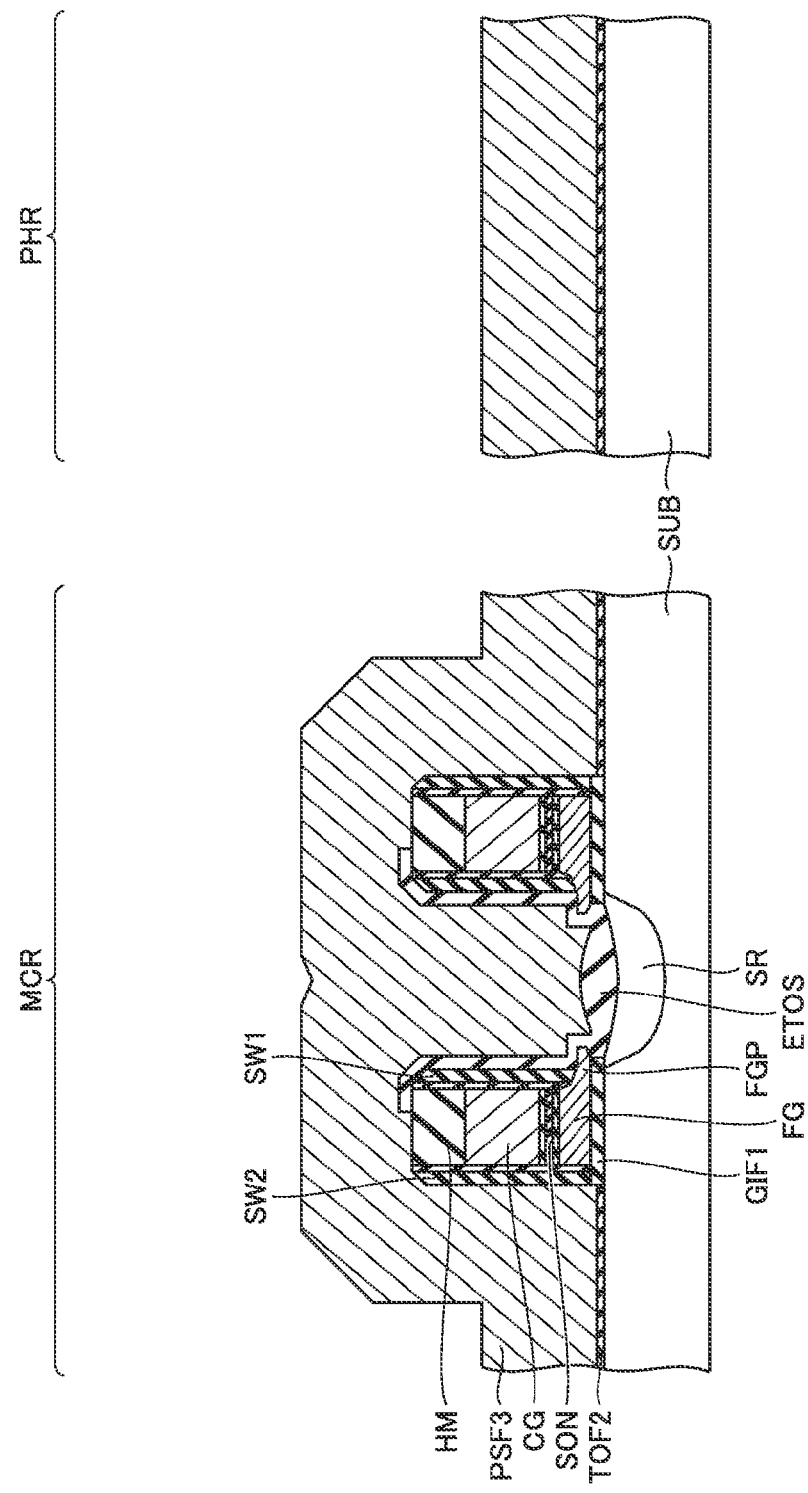
FIG. 40 is a cross-sectional view showing a step performed after the step shown in FIG. 39 in the same embodiment.
Figure 41:
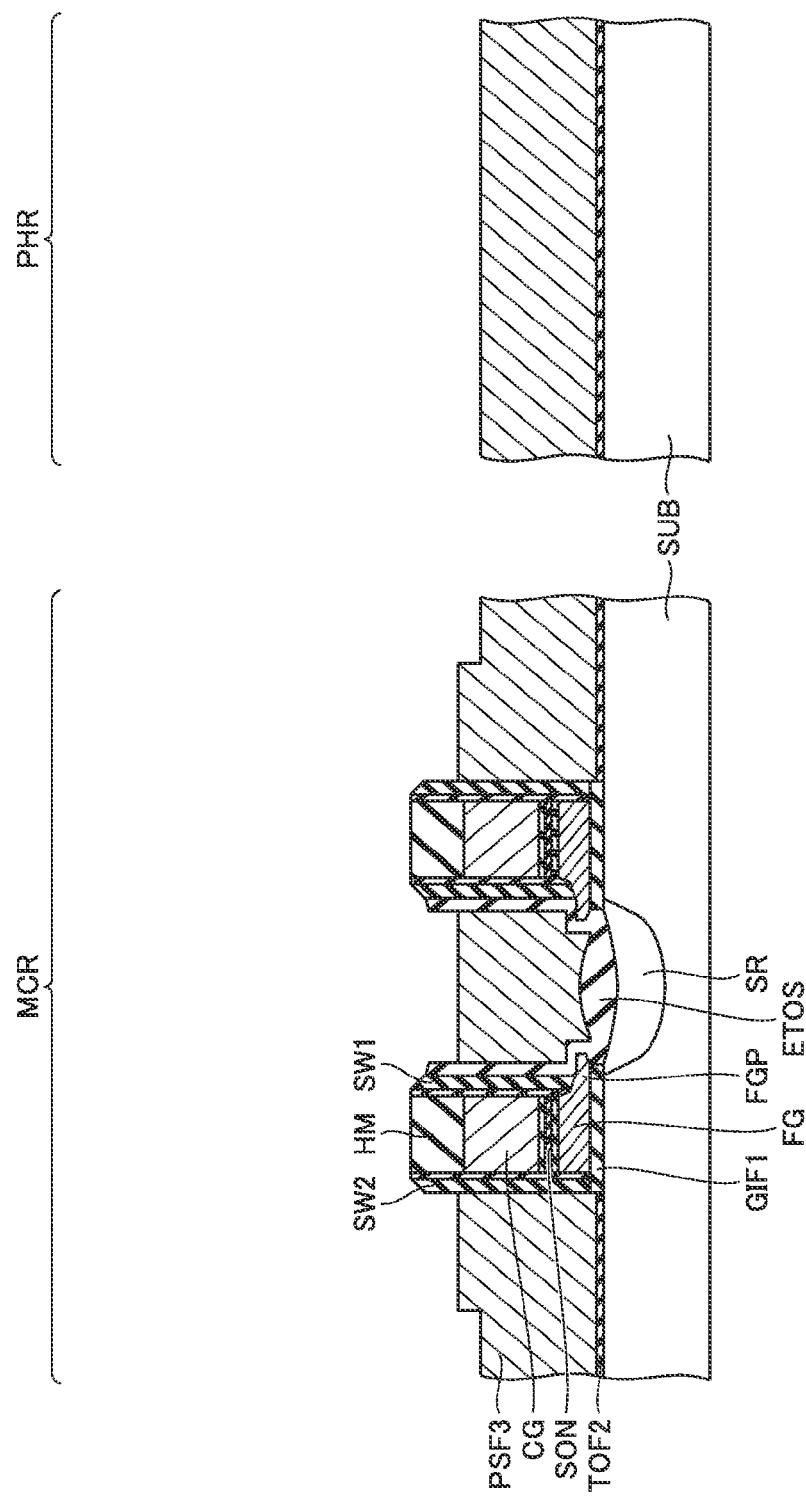
FIG. 41 is a cross-sectional view showing a step performed after the step shown in FIG. 40 in the same embodiment.

Then, as shown in FIG. 40, polysilicon film PSF3 is formed by a CVD process, for example, to cover memory cell region MCR and peripheral circuit region PHR. Then, a chemical mechanical polishing process and an etching process are performed on polysilicon film PSF3. Consequently, as shown in FIG. 41, polysilicon film PSF3 is planarized so as to expose silicon nitride film HM located immediately above control gate electrode CG.

Figure 42:
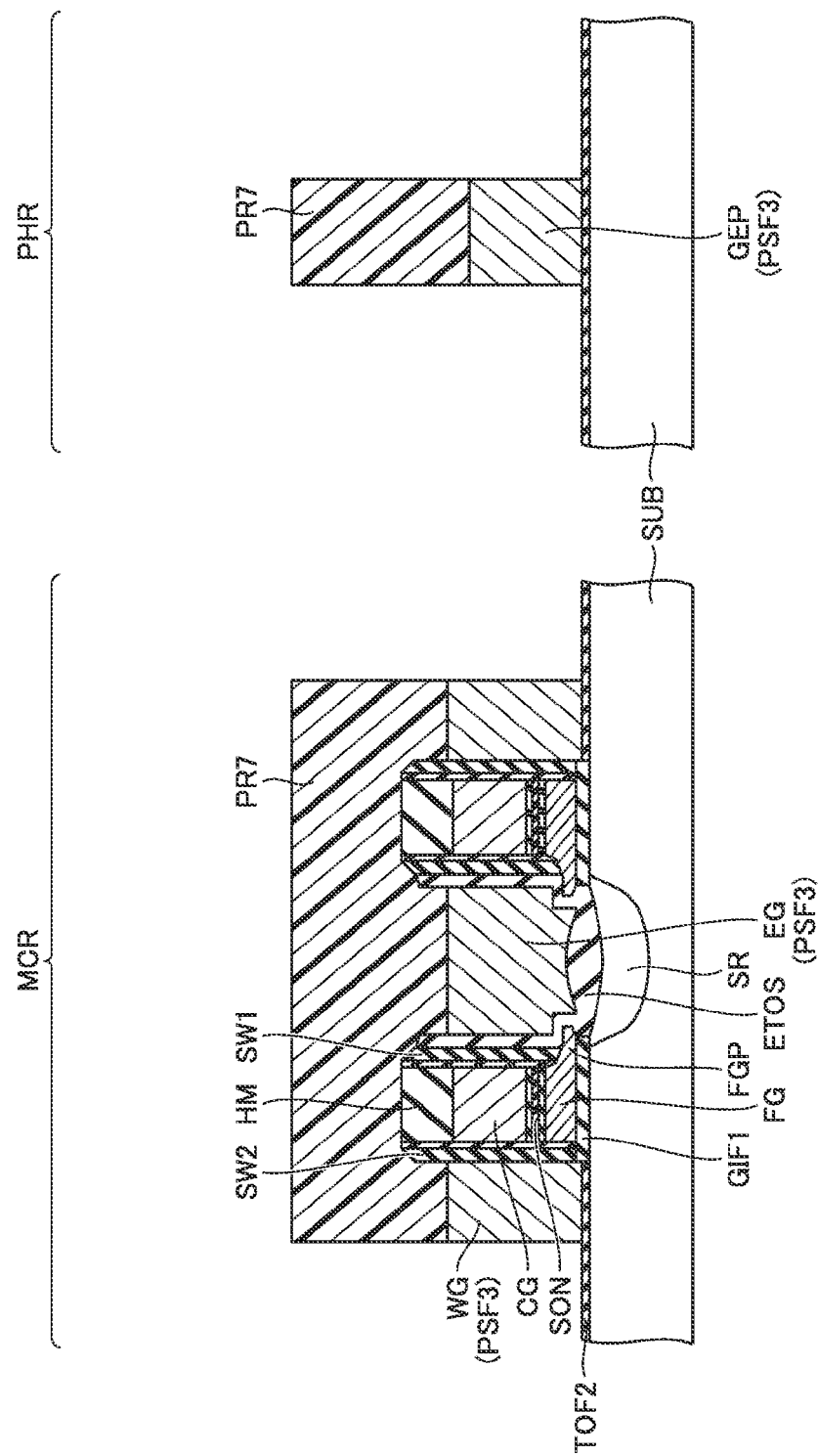
FIG. 42 is a cross-sectional view showing a step performed after the step shown in FIG. 41 in the same embodiment.

Then, as shown in FIG. 42, a prescribed photolithography process is performed to form photoresist pattern PR7. Then, an etching process is performed with photoresist pattern PR7 as an etching mask. Consequently, select gate electrode WG and erase gate electrode EG are formed in memory cell region MCR. Gate electrode GEP of the peripheral transistor is formed in peripheral circuit region PHR. Photoresist pattern PR7 is then removed.

Then, a prescribed implantation process is performed to form drain region DR in memory cell region MCR (see FIG. 32), and form source/drain region SDR in peripheral circuit region PHR (see FIG. 32). Subsequently, liner film LF, interlayer insulating film ILF and the like covering memory cell region MCR and peripheral circuit region PHR are formed, and furthermore, contact plugs CPG, multilayer wiring structure MHS (both shown in FIG. 32) and the like are formed, to thereby complete the substantial part of the semiconductor device.

Next, the operation of the flash memory in the above-discussed semiconductor device is described. First, in write operation, in a manner similar to that of the above-discussed semiconductor device, electrons are injected into floating gate electrode FG by the source-side injection. Next, in read operation, again in a manner similar to that of the above-discussed semiconductor device, it is determined whether or not the electrons (information) have been stored in floating gate electrode FG based on whether or not the read current is detected.

Figure 43:
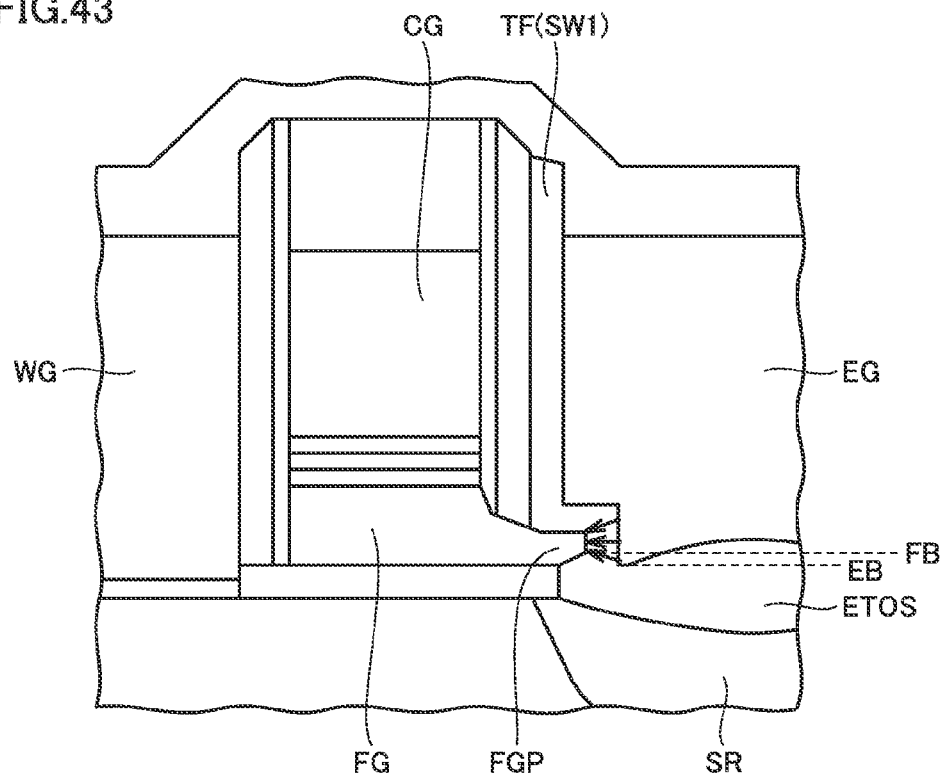
FIG. 43 is a fragmentary enlarged cross-sectional view showing an electric field, to illustrate erase operation in the same embodiment.
Figure 44:
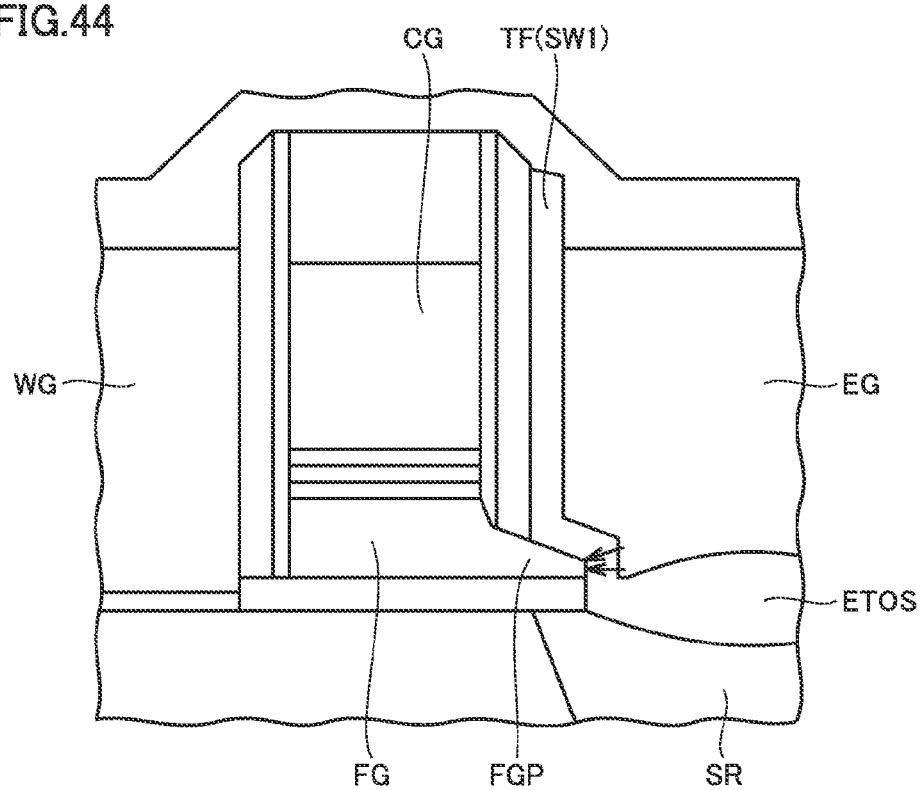
FIG. 44 is a fragmentary enlarged cross-sectional view showing a comparative electric field, to illustrate erase operation in the same embodiment.

Erase operation is described next. When information is to be erased, in a manner similar to that of the above-discussed semiconductor device, a voltage of 11 V is applied to erase gate electrode EG, for example. On this occasion, as shown in FIG. 43, the position of the lower end of erase gate electrode EG (see dotted line EB) is lower than the position of the lower end of the tip portion of protruding portion FGP (see dotted line FB). Accordingly, in protruding portion FGP of floating gate electrode FG, an electric line of force (electric field) wraps around the lower end side of protruding portion FGP as well more readily than in the above-discussed semiconductor device shown in FIG. 44, thus allowing further concentration of the electric field.

Figure 45:
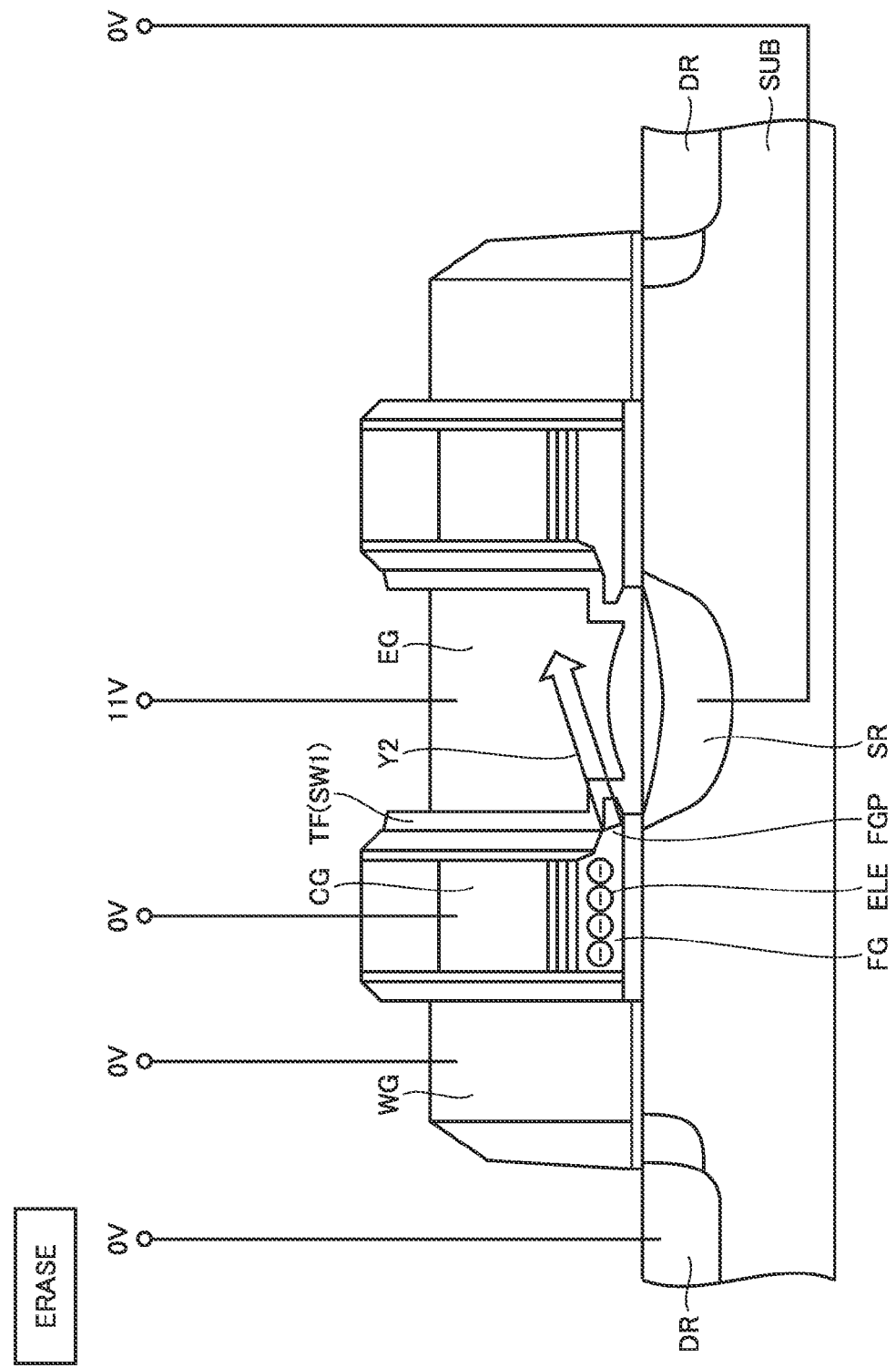
FIG. 45 is a cross-sectional view to illustrate erase operation in the same embodiment.

Consequently, as shown in FIG. 45, in floating gate electrode FG where electrons ELE have been stored, electrons ELE can be drawn faster into erase gate electrode EG (see an arrow Y2). The length of arrow Y2 is longer than the length of arrow Y1 (see FIG. 24), indicating that electrons ELE are drawn faster. As a result, electrons ELE (information) stored in floating gate electrode FG can be more reliably erased to further improve the erase characteristics.

It is noted that the semiconductor devices and the methods of manufacturing the same described in the embodiments can be combined in various ways as needed.

While the invention made by the present inventor has been specifically described above based on the embodiments, it goes without saying that the present invention is not limited to the embodiments described above, but can be modified in various ways without departing from the substance of the invention.

What is claimed is:

1. A semiconductor device including a flash memory, comprising:
    a floating gate electrode having a first thickness and formed on a semiconductor substrate with a first gate insulating film interposed therebetween;
    a control gate electrode formed on the floating gate electrode with a first insulating film interposed therebetween; and
    an erase gate electrode formed on one side surface of the control gate electrode with a sidewall insulating film including a tunnel insulating film interposed therebetween,
    the floating gate electrode including a protruding portion protruding toward the erase gate electrode so as to flare from a portion located immediately below the control gate electrode, the protruding portion having an end face of a height corresponding to a second thickness smaller than the first thickness and an inclined surface continuous with the end face,
    the protruding portion facing the erase gate electrode with the tunnel insulating film interposed therebetween, and
    the tunnel insulating film has a first face located along the end face of the protruding portion and a second face located along the inclined surface of the protruding portion, the first face and the second face of the tunnel insulating film making contact with the erase gate electrode.

2. The semiconductor device according to claim 1, wherein
    the erase gate electrode is formed on the semiconductor substrate with a second insulating film interposed therebetween,
    a source region is formed in the semiconductor substrate immediately below the second insulating film, and
    the second insulating film is continuous with the first gate insulating film.

3. The semiconductor device according to claim 2, comprising a select gate electrode formed on the semiconductor substrate with a second gate insulating film interposed therebetween, wherein
    the second insulating film includes a portion having a thickness greater than a film thickness of the second gate insulating film.

4. The semiconductor device according to claim 3, wherein
    the position of a lower end of the erase gate electrode is lower than the position of a lower end of the protruding portion of the floating gate electrode.

5. The semiconductor device according to claim 1, wherein
    the erase gate electrode is formed to extend in a first direction, and
    the floating gate electrode and the control gate electrode are arranged line-symmetrically with respect to a center of the erase gate electrode in a second direction intersecting the first direction.

6. The semiconductor device according to claim 1, wherein
    in the semiconductor substrate, a memory cell region in which the flash memory is formed and a peripheral circuit region in which a peripheral circuit is formed are defined by an element isolation region, and
    in the peripheral circuit region, a semiconductor element including a peripheral transistor is formed.

7. A method of manufacturing a semiconductor device including a flash memory, comprising the steps of:
    forming a first gate insulating film on a surface of a semiconductor substrate;
    successively forming a first conductive film having a first film thickness, a first insulating film, and a second conductive film on the first gate insulating film;
    forming a first mask material on the second conductive film;
    performing an etching process on the second conductive film with the first mask material as an etching mask, to form a control gate electrode;
    further performing an etching process on the first conductive film with the first mask material as an etching mask, to remove the first conductive film while leaving the first conductive film on the first gate insulating film so as to flare from a portion located immediately below the second conductive film toward a direction intersecting a direction in which the control gate electrode extends;

forming a second mask material to cover side surfaces of the control gate electrode;

performing an etching process on the remaining first conductive film with the second mask material as an etching mask, to form a floating gate electrode including a protruding portion protruding from one of the side surfaces of the control gate electrode for a length corresponding to a thickness of the second mask material, the protruding portion having an end face of a height corresponding to a second film thickness smaller than the first film thickness and an inclined surface continuous with the end face;

forming a tunnel insulating film to cover the protruding portion of the floating gate electrode; and forming an erase gate electrode to face the protruding portion of the floating gate electrode with the tunnel insulating film interposed therebetween, wherein in the step of forming the tunnel insulating film, the tunnel insulating film is formed to have a first face located along the end face of the protruding portion and a second face located along the inclined surface of the protruding portion, and in the step of forming an erase gate electrode, the erase gate electrode s formed to make contact with the first face and the second face of the tunnel insulating film.

8. The method of manufacturing a semiconductor device according to claim 7, wherein the step of forming a first conductive film includes the step of forming a monitor pattern of the first conductive film on the semiconductor substrate, and the step of removing the first conductive film includes the steps of measuring a film thickness of the monitor pattern of the first conductive film, calculating etching time for removing the first conductive film while leaving the first conductive film on the first gate insulating film based on the measured film thickness of the first conductive film, and performing an etching process on the first conductive film based on the calculated etching time.

9. The method of manufacturing a semiconductor device according to claim 7, comprising the steps of:

implanting an impurity of a prescribed conductivity type into a first region of the semiconductor substrate in which the erase gate electrode is to be formed, to form a source region;

performing a thermal oxidation process to form a second insulating film continuous with the first gate insulating film in the first region of the semiconductor substrate, and form a second gate insulating film in a second region of the semiconductor substrate located across the floating gate electrode from the first region; and forming the erase gate electrode in the first region of the semiconductor substrate with the second insulating film interposed therebetween, and forming a select gate electrode in the second region of the semiconductor substrate with the second gate insulating film interposed therebetween.

10. The method of manufacturing a semiconductor device according to claim 9, wherein the step of forming a second insulating film includes the step of forming the second insulating film such that the position of a lower end of the protruding portion is higher than the position of a lower end of the erase gate electrode by raising the protruding portion of the floating gate from below by accelerating oxidation by the thermal oxidation process by adjusting an amount of the impurity implanted into the first region.

11. The method of manufacturing a semiconductor device according to claim 9, comprising the steps of:

defining a memory cell region in which the flash memory is formed and a peripheral circuit region in which a peripheral circuit is formed, by forming an element isolation region in the semiconductor device; and forming a peripheral transistor including a gate electrode in the peripheral circuit region, wherein in the step of forming a peripheral transistor, the gate electrode is formed simultaneously with the erase gate electrode and the select gate electrode.

* * * * *